United States Patent
Inouchi et al.

(10) Patent No.: US 10,829,503 B2
(45) Date of Patent: Nov. 10, 2020

(54) DIBENZOPYRROMETHENE BORON CHELATE COMPOUND, NEAR-INFRARED LIGHT ABSORBING MATERIAL, THIN FILM AND ORGANIC ELECTRONICS DEVICE

(71) Applicant: Nippon Kayaku Kabushiki Kaisha, Tokyo (JP)

(72) Inventors: Toshifumi Inouchi, Tokyo (JP); Tatsuya Aotake, Tokyo (JP); Hidenori Yakushiji, Tokyo (JP); Masahiro Abe, Tokyo (JP); Shoji Shinamura, Tokyo (JP); Yuichi Sadamitsu, Tokyo (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 34 days.

(21) Appl. No.: 16/344,979

(22) PCT Filed: Oct. 26, 2017

(86) PCT No.: PCT/JP2017/038702
§ 371 (c)(1),
(2) Date: Apr. 25, 2019

(87) PCT Pub. No.: WO2018/079653
PCT Pub. Date: May 3, 2018

(65) Prior Publication Data
US 2019/0270758 A1  Sep. 5, 2019

(30) Foreign Application Priority Data
Oct. 28, 2016 (JP) ................... 2016-211280
Apr. 28, 2017 (JP) ................... 2017-089780

(51) Int. Cl.
*C07F 5/02* (2006.01)
*H01L 51/00* (2006.01)
(Continued)

(52) U.S. Cl.
CPC ............... *C07F 5/022* (2013.01); *C07F 5/02* (2013.01); *C09B 23/00* (2013.01); *C09K 3/00* (2013.01);
(Continued)

(58) Field of Classification Search
CPC . C07F 5/022; C07F 5/02; C09B 23/00; C09K 3/00; C09K 11/06; H01L 51/005; H01L 51/42
See application file for complete search history.

(56) References Cited

FOREIGN PATENT DOCUMENTS

| JP | 11255774 A | 9/1999 |
|---|---|---|
| JP | 2012199541 | * 10/2012 |

(Continued)

OTHER PUBLICATIONS

Lu et al., Structural modification strategies for the rational design of red/NIR region BODIPYs, Chemical Society Reviews, Jul. 2014, pp. 1-93, vol. 43.

(Continued)

*Primary Examiner* — Jayne L Mershon
(74) *Attorney, Agent, or Firm* — The Webb Law Firm

(57) ABSTRACT

A dibenzopyrromethene boron chelate compound is represented by the following formula (1):

[Formula 1]

(1)

(Continued)

in which $X_1$ to $X_6$ in the above formula (1) are each independently of one another a sulfur atom, a carbon atom having a hydrogen atom, or a carbon atom having a substituent $R_0$, and the substituent $R_0$ represents an alkyl group, an alkoxy group, an alkylthio group, an aromatic group, a halogen atom, a hydroxyl group, a mercapto group, a nitro group, a substituted amino group, an unsubstituted amino group, a cyano group, a sulfo group, an acyl group, a sulfamoyl group, an alkylsulfamoyl group, a carbamoyl group, or an alkylcarbamoyl group; and adjacent groups of $X_1$ to $X_6$ may be connected to each other to form a ring structure. The compound has an absorption band in a near-infrared light region, and a B—O chelate structure due to a thiophene ring.

19 Claims, 4 Drawing Sheets

(51) Int. Cl.
*H01L 51/42* (2006.01)
*C09K 3/00* (2006.01)
*C09K 11/06* (2006.01)
*C09B 23/00* (2006.01)
*H01L 51/50* (2006.01)

(52) U.S. Cl.
CPC ............ *C09K 11/06* (2013.01); *H01L 51/005* (2013.01); *H01L 51/42* (2013.01); *H01L 51/50* (2013.01); *Y02E 10/549* (2013.01)

(56) References Cited

FOREIGN PATENT DOCUMENTS

| | | |
|---|---|---|
| JP | 2012199541 A | 10/2012 |
| JP | 201465685 A | 4/2014 |
| JP | 201477042 A | 5/2014 |
| JP | 20166033 A | 1/2016 |
| JP | 2016166284 A | 9/2016 |
| WO | 2013035303 A1 | 3/2013 |

OTHER PUBLICATIONS

Loudet and Burgess, BODIPY Dyes and Their Derivatives: Syntheses and Spectroscopic Properties, Chemical Reviews, 2007, pp. 4891-4932, vol. 107, No. 11.

* cited by examiner

DIBENZOPYRROMETHENE BORON CHELATE COMPOUND, NEAR-INFRARED LIGHT ABSORBING MATERIAL, THIN FILM AND ORGANIC ELECTRONICS DEVICE

CROSS-REFERENCE TO RELATED APPLICATIONS

This application is the United States national phase of International Application No. PCT/JP2017/038702 filed Oct. 26, 2017, and claims priority to Japanese Patent Application Nos. 2016-211280 filed Oct. 28, 2016, and 2017-089780 filed Apr. 28, 2017, the disclosures of which are hereby incorporated by reference in their entirety.

TECHNICAL FIELD

The present invention relates to a novel dibenzopyrromethene boron chelate compound, and applications of a material containing the compound. The present invention particularly relates to a novel dibenzopyrromethene boron chelate compound having an absorption band in a near-infrared light region, and applications of a near-infrared light absorbing material, a thin film and an organic electronics device including the above compound.

BACKGROUND ART

Near-infrared light absorbing materials having an absorption band in a region of 700 nm or more and 2500 nm or less have been conventionally studied for use in various industrial applications. Examples of the applications include light information recording media such as CD-R (Compact Disk-Recordable); printing applications such as thermal CTP (Computer To Plate), flash toner fixing and heat-sensing type laser recording; heat insulation films, and the like. In addition, by the utilization of properties of absorbing light within a specific wavelength range selectively, near-infrared light absorbing materials are also used in near-infrared light cut filter used in PDP (Plasma Display Panel) and the like, as well as films for plant development regulation, and the like. On the other hand, a near-infrared light absorbing dye can be used as a near-infrared light absorbing ink by dissolving or dispersing the dye in a solvent. The printed matter by the near-infrared light absorbing ink is difficult to be visually identified, and can be read only by a near-infrared light detector and the like, and is therefore used in printed matter and the like for the sake of, for example, anti-falsification and the like.

As an infrared light absorbing material for forming such an invisible printed matter, infrared light absorbing materials of inorganic type and infrared light absorbing materials of organic type have been known. Among these, as an infrared light absorbing material of inorganic type, rare earth metal such as ytterbium and copper phosphate type glass-ceramics are known. However, the infrared light absorbing material of inorganic type does not have sufficient light absorption ability in a near-infrared region, and therefore, the infrared light absorbing material is required to be in a large amount per unit area of the invisible printed matter. Therefore, in the case where an invisible printed matter is formed by the infrared light absorbing material of inorganic type, when a visible image is further formed on the surface of the invisible printed matter, depressions and projections of the underlying invisible image have influence on the visible printed matter in the side of this surface.

By contrast, due to the fact that the infrared light absorbing material of organic type has a sufficient ability to absorb light in a near-infrared region, and as a result of this, the usage amount of the invisible printed matter per unit area can be in a small amount, and therefore, there is no inconvenience in a case where the infrared light absorbing material of inorganic type is used. Therefore, many organic type near-infrared light absorbing materials have been developed to date.

Examples of dyes exhibiting an absorption band in a near-infrared region include cyanine dye, squarylium dye, diimmonium dye, and the like; however, any of these has poor robustness, and the applications have been limited. On the other hand, boron dipyrromethene (boron-dipyrromethene; herein below, referred to as "BODIPY".) type dye have been diligently studied in recent years as a dye exhibiting an absorption band and a fluorescence band in a wavelength region from red light to near-infrared light (Non Patent Literature 1). In addition, a simple BODIPY dye shows an intense absorption band at approximately 500 nm; however, the absorption wavelength of this simple BODIPY dye can be broadened to a near-infrared light region by extending π conjugation system, or by introducing an aromatic group with an electron donating substituent (Non Patent Literature 2).

A dibenzopyrromethene boron chelate compound having the pyrrole ring of the BODIPY backbone condensed shows an absorption band shifted to longer wavelength in relation to non-condensed type BODIPY (Non Patent Literature 1, Non Patent Literature 2), and therefore it is reported that the compound can be utilized in an optical recording medium, in terms of utility as a near-infrared light absorbing material (Patent Literature 1). In addition, the condensed structure by B—O chelation can provide further longer wavelength shift (Non Patent Literature 1, and Non Patent Literature 2), and the organic thin films using this condensed structure have been reported (Patent Literature 2, Patent Literature 3, and Patent Literature 4). In addition, Patent Literature 4 does not describe the synthesis examples; however, Patent Literature 4 describes a dipyrromethene boron chelate compound having B—O chelation by linkage of hetero rings to 3 and 5-positions of BODIPY, respectively.

CITATION LITERATURE

Patent Literature

Patent Literature 1: Japanese Patent Laid-Open No. 1999-255774
Patent Literature 2: Japanese Patent Laid-Open No. 2012-199541
Patent Literature 3: Japanese Patent Laid-Open No. 2016-166284
Patent Literature 4: International Publication No. 2013/035303

Non Patent Literature

Non Patent Literature 1: Chem. Soc. Rev., 2014, 43, 4778-4823
Non Patent Literature 2: Chem. Rev., 2007, 107, 4891-4932

SUMMARY OF INVENTION

Technical Problem

Currently mainstream near-infrared light absorbing dyes involves problems such as insufficient heat resistance and light resistance, and it is desired to develop a material with a great industrial applicability and high durability to light. In particular, a material for various organic electronics device applications such as organic photoelectric conversion devices is required to have sufficient performance due to high electron transportability, high positive hole transportability, as well as high performance of requirement such as heat resistance to process temperatures.

BODIPY with a relatively excellent heat resistance is a promising material meeting the above requirements; however, there are a small number of materials having an absorption band in a near-infrared light region, and with regard to some of the materials having an absorption band in a near-infrared light region involves, the most of the absorption is in a visible part region, or almost all of these materials are difficult to be synthesized. For example, B—O chelate type dibenzopyrromethene boron chelate compound illustrated in Patent Literature 2 is studied for applications in organic thin film solar battery devices; however, this chelate compound is not a near-infrared light absorbing material such that the end of photoelectric conversion wavelength is in the order of up to 800 nm, and the main absorption band is in a near-infrared light region. It is an object of the present invention to provide a new compound which is can be used in a dye having a main absorption band in a near-infrared light region (hereinbelow, referred to as "near-infrared light absorbing dye", or "near-infrared light absorbing material") that is industrially usable, has high durability to light, and in addition, is easily processed to enable the use in organic electronics devices and the like.

Solution to Problem

As a result of researches by the present inventors in order to solve the above problems, we have developed a novel dibenzopyrromethene boron chelate compound in which aromatic rings linked to 3 and 5-positions of BODIPY, respectively, form a six-membered ring each by B—O chelation, and we have discovered that a thin film using this chelate compound has a main absorption band in a near-infrared light region, and in addition, a near-infrared photoelectric conversion device and an organic electronics device using this chelate compound have sufficient performance, and have accomplished the present invention. In other words, the present invention is as follows.

[1] A compound represented by the following formula (1):

[Formula 1]

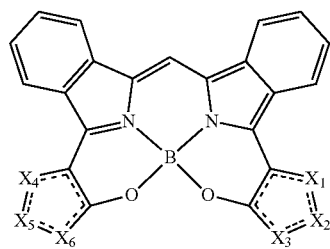
(1)

wherein $X_1$ to $X_6$ in the formula (1) are each independently of one another a sulfur atom, a carbon atom having a hydrogen atom, or a carbon atom having a substituent $R_0$, and the substituent $R_0$ represents an alkyl group, an alkoxy group, an alkylthio group, an aromatic group, a halogen atom, a hydroxyl group, a mercapto group, a nitro group, a substituted amino group, an unsubstituted amino group, a cyano group, a sulfo group, an acyl group, a sulfamoyl group, an alkylsulfamoyl group, a carbamoyl group, or an alkylcarbamoyl group; and adjacent groups of $X_1$ to $X_6$ may be connected to each other to form a ring structure;

[2] The compound according to item [1], wherein at least one of $X_1$ to $X_3$ is a sulfur atom, and at least one of $X_4$ to $X_6$ is a sulfur atom;

[3] A compound represented by any of the following formula (2a), formula (2b) and formula (2c):

[Formula 2]

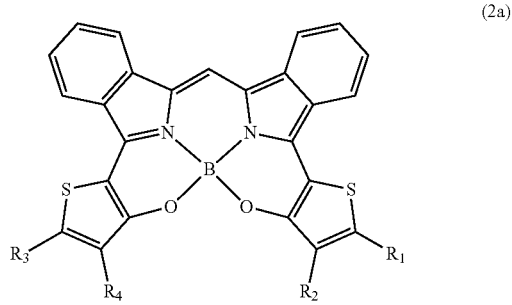
(2a)

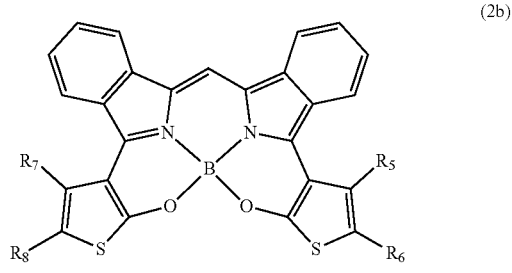
(2b)

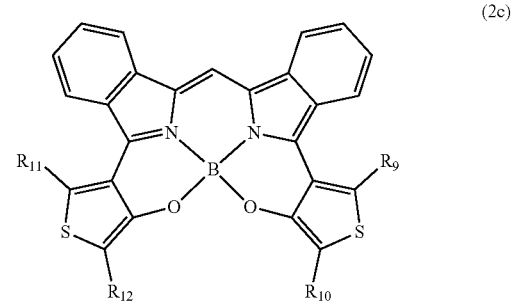
(2c)

wherein $R_1$ to $R_{12}$ in the above formulae (2a), (2b) and (2c) each represent independently of one another a hydrogen atom, an alkyl group, an alkoxy group, an alkylthio group, an aromatic group, a halogen atom, a hydroxyl group, a mercapto group, a nitro group, a substituted amino group, an unsubstituted amino group, a cyano group, a sulfo group, an acyl group, a sulfamoyl group, an alkylsulfamoyl group, a carbamoyl group, or an alkylcarbamoyl group; and adjacent groups of $R_1$ to $R_{12}$ may be connected to each other to form a ring structure;

[4] A compound represented by the following formula (2a):

[Formula 3]

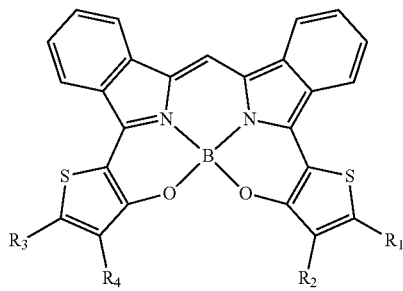

(2a)

wherein $R_1$ to $R_4$ in the above formula (2a) each represent independently of one another a hydrogen atom, an alkyl group, an alkoxy group, an alkylthio group, an aromatic group, a halogen atom, a hydroxyl group, a mercapto group, a nitro group, a substituted amino group, an unsubstituted amino group, a cyano group, a sulfo group, an acyl group, a sulfamoyl group, an alkylsulfamoyl group, a carbamoyl group, or an alkylcarbamoyl group; and adjacent groups of $R_1$ to $R_4$ may be connected to each other to form a ring structure;
[5] An infrared light absorbing material comprising the compound according to any one of items [1] to [4];
[6] A thin film comprising the compound according to any one of items [1] to [4];
[7] An organic electronics device comprising the compound according to any one of items [1] to [4];
[8] An organic photoelectric conversion device comprising the compound according to any one of items [1] to [4];
[9] An organic electroluminescence device comprising the compound according to any one of items [1] to [4].

Advantageous Effect of Invention

The dibenzopyrromethene boron chelate compound represented by the formula (1) of the present invention can be formed as a film by a vapor deposition process, and this organic thin film has a main light absorption band in a near-infrared light region. In addition to this fact, this compound and/or this thin film can provide a near-infrared photoelectric conversion device, and can be utilized in various organic electronics devices.

DESCRIPTION OF EMBODIMENTS

Figure 1:
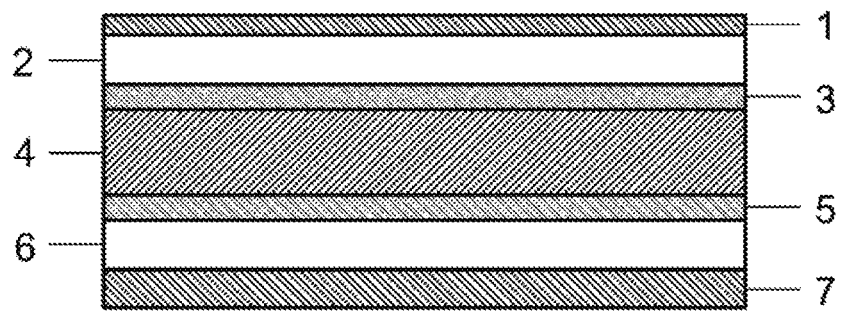
FIG. 1 shows a cross-sectional view illustrating an exemplary embodiment of a photoelectric conversion device of the present invention.

Hereinbelow, the content of the present invention will be described in detail. The description of the configuration requirements described herein is based on representative embodiments and specific examples of the present invention, whereas the present invention is not limited to these embodiment and specific example. It is noted that a numerical range represented using "to" herein means a range including numbers before and after "to" as lower limit value and upper limit value, respectively. In addition, in the present invention, a near-infrared light region refers to a wavelength region in a range of 700 nm or more and 2500 nm or less, and a near-infrared light absorbing material (dye) refers to a material having a main absorption wavelength in a near-infrared light region, and a near-infrared light-emitting material (dye) refers to a material that emits light in a near-infrared light region. In particular, a compound represented by the formula (1) of the present invention has a longer wavelength of maximum absorption wavelength within a range of 700 nm or more and 2500 nm or less than to a conventional material.

A compound of the present invention is represented by the following general formula (1):

[Formula 4]

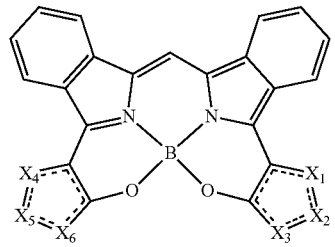

(1)

wherein $X_1$ to $X_6$ in the formula (1) are each independently of one another a sulfur atom, a carbon atom having a hydrogen atom, or a carbon atom having a substituent $R_0$, and the substituent $R_0$ represents an alkyl group, an alkoxy group, an alkylthio group, an aromatic group, a halogen atom, a hydroxyl group, a mercapto group, a nitro group, a substituted amino group, an unsubstituted amino group, a cyano group, a sulfo group, an acyl group, a sulfamoyl group, an alkylsulfamoyl group, a carbamoyl group, or an alkylcarbamoyl group; and adjacent groups of $X_1$ to $X_6$ may be connected to each other to form a ring structure.

A compound represented by the above formula (1) is a dibenzopyrromethene boron chelate compound in which aromatic rings of a five-membered ring linked to 3 and 5 positions of BODIPY, respectively, form a six-membered ring each by B—O chelation. The compound represented by the above formula (1) can be used as a near-infrared light absorbing dye having a longer wavelength than an existing compound in which benzene rings are linked to 3 and 5 positions, respectively. It is noted that the structural formula of the formula (1) is solely one of the resonance structures, and is not limited to the illustrated resonance structure.

Here, the superiority of the present backbone is explained with regard to a study by a theoretical calculation. With regard to the compounds of the present invention having B—O chelation by thiophene rings used for the substitution at 3 and 5-positions of BODIPY, respectively, in which $X_1=X_4=S$ and $X_2=X_3=X_5=X_6=CH$ in the above formula (1), as well as an existing molecule having B—O chelation by benzene rings used for the substitution at 3 and 5-positions of BODIPY, respectively, the most stable structure in the ground state was calculated by a density functional method using quantum chemical calculation by Gaussian 09. The calculation conditions were based on B3LYP exchange-correlation functional using basis function 6-31G (d). As a result, the above compound of the present invention in which $X_1=X_4=S$ and $X_2=X_3=X_5=X_6=CH$ has a dihedral angle between the thiophene ring and the pyrrole ring of the BODIPY backbone of 16.8°, whereas the existing molecule having B—O chelation by benzene rings used for the substitution at 3 and 5-positions of BODIPY, respectively, has a dihedral angle between the benzene ring and the pyrrole ring of the BODIPY backbone of 19.2°. From the above findings, a novel dibenzopyrromethene boron chelate compound of the present invention represented by the above formula (1) has improved planarity in relative to the existing molecules, and has an advantageous structure for the delocalization of π electrons.

In addition, when the calculation of the excited state was conducted by a time-dependent density functional method at a level of B3LYP/6-31G (d), in case of the compound of the present invention in which the above $X_1=X_4=S$ and $X_2=X_3=X_5=X_6=CH$, the transition between HOMO and LUMO are calculated to be 636 nm, whereas in case of an existing molecule having B—O chelation by benzene rings used for the substitution at 3 and 5-positions of BODIPY, respectively, this transition was 602 nm. From these results, it is suggested that the introduction of a hetero ring such as a thiophene ring reduce the energy difference between HOMO and LUMO in relative to conventional BODIPY dye. From the above-described idea, the compound of the present invention has a broader absorption band in a near-infrared light region than the existing BODIPY dye, and can be used as a near-infrared light absorbing dye with excellent light absorption ability. Here, $X_1$ to $X_6$ may be the same as or different from each other, and it is preferable in terms of synthesis that the molecule backbone has a symmetric structure. In other words, in the above formula (1), a structure where $X_1=X_4$, $X_2=X_6$, and $X_3=X_5$ is preferable.

Examples of the alkyl group in the above formula (1) include linear or branched alkyl groups having 1 to 12 carbon atoms such as methyl, ethyl, propyl, butyl, pentyl, hexyl, heptyl, octyl, nonyl, decyl, undecyl and dodecyl groups, as well as cyclic alkyl groups having 3 to 6 carbon atoms such as cyclopropyl, cyclobutyl, cyclopentyl and cyclohexyl groups.

Examples of the alkoxy group in the above formula (1) include an alkoxy group in which an alkyl group is connected to an oxygen atom; however, there is no limitation with regard to the number of oxygen atoms, the position, and the number of branching. Examples of an alkyl group possessed by the alkoxy group include the same one as the above-described linear or branched alkyl groups having 1 to 12 carbon atoms, and cyclic alkyl groups having 3 to 6 carbon atoms.

Examples of the alkylthio group in the above formula (1) include an alkylthio group in which an alkyl group is connected to a sulfur atom; however, there is no limitation with regard to the number of sulfur atoms, the position, and the number of branching. Examples of the alkyl group possessed by the alkylthio group include the same one as the above-described linear or branched alkyl groups having 1 to 12 carbon atoms, and cyclic alkyl groups having 3 to 6 carbon atoms.

Examples of an aromatic group in the above formula (1) include aromatic hydrocarbon groups such as phenyl, biphenyl, indenyl, naphthyl, anthryl, fluorenyl and pyrenyl groups, aromatic heterocyclic groups such as furanyl, thienyl, thienothienyl, pyrrolyl, imidazolyl, N-methylimidazolyl, thiazolyl, oxazolyl, pyridyl, pyrazyl and pyrimidyl groups, as well as condensed polycyclo-aromatic heterocyclic groups such as quinolyl, indolyl, benzopyrazyl, benzopyrimidyl, benzothienyl, benzothiazolyl, pyridinothiazolyl, benzoimidazolyl, pyridinoimidazolyl, N-methylbenzoimidazolyl, pyridino-N-methylimidazolyl, benzooxazolyl, pyridinooxazolyl, benzothiadiazolyl, pyridinothiadiazolyl, benzooxadiazolyl, pyridinooxadiazolyl, carbazolyl, phenoxyazinyl, phenothiazinyl, N-methylphthalimide and N-methyl-1,8-naphthalimide groups, and an aromatic heterocyclic group or a condensed polycyclo-aromatic heterocyclic group is preferable. In addition, various substituents can be introduced into these aromatic groups, and examples of these substituents that may be introduced include the same one as substituent $R_0$.

Examples of a halogen atom in the above formula (1) include a fluorine atom, a chlorine atom, a bromine atom and an iodine atom. Examples of the above substituted amino group include amino groups in which a hydrogen atom of an unsubstituted amino group (—$NH_2$ group) is replaced with substituent $R_0$, and among these, an amino group in which this hydrogen atom is replaced with the above aromatic group is preferable. Examples of an acyl group in the above formula (1) include an acyl group in which an aromatic group or an alkyl group is connected to a carbonyl group, and examples of an alkyl group in the aromatic group and acyl group in this acyl group include the same alkyl group as those in the alkyl group in the above formula (1) and in the aromatic group the formula (1). Examples of the alkylsulfamoyl group in the above formula (1) include an alkylsulfamoyl group in which a hydrogen atom of a sulfamoyl group is replaced with an alkyl group, and examples of the alkyl group in this alkylsulfamoyl group include the same alkyl group as the alkyl group in the above formula (1). Examples of the alkylcarbamoyl group in the above formula (1) include an alkylcarbamoyl group in which a hydrogen atom of the carbamoyl group is replaced with the above alkyl group, and examples of the alkyl group in this alkylcarbamoyl group include the same one as the above-described alkyl group in the formula (1).

As a carbon atom having a substituent $R_0$ represented by $X_1$ to $X_6$ in the formula (1), in terms of availability of source materials and the easiness of the synthesis, a carbon atom having an alkyl group, a halogen atom, an aromatic group or a substituted amino group as a substituent $R_0$ is preferable, and in addition, also taking the achievement of longer wavelength of the absorption wavelength into consideration, a carbon atom having aromatic group or substituted amino group is more preferable.

Examples of a cyclic structure that can be formed by connecting adjacent groups of $X_1$ to $X_6$ to each other include five-membered aromatic rings and six-membered aromatic rings, such as benzene ring, naphthalene ring, furan ring, pyrrole ring, imidazole ring, thiophene ring, pyrazole ring, oxazole ring, thiazole ring, pyridine ring and pyrazine ring. Among them, a cyclic structure formed by a benzene ring and a thiophene ring is preferable, and more specifically, cyclic structure that form a benzothiophene ring and a thienothiophene ring by a thiophene ring including $X_1$ to $X_6$ is preferable. In addition, these ring structures may have a substituent, and the specific examples and preferable examples of the substituent are similar to those as in substituent $R_0$.

A compound as one of preferable embodiments of the present invention is represented by any of the following formula (2a), formula (2b) and formula (2c):

[Formula 5]

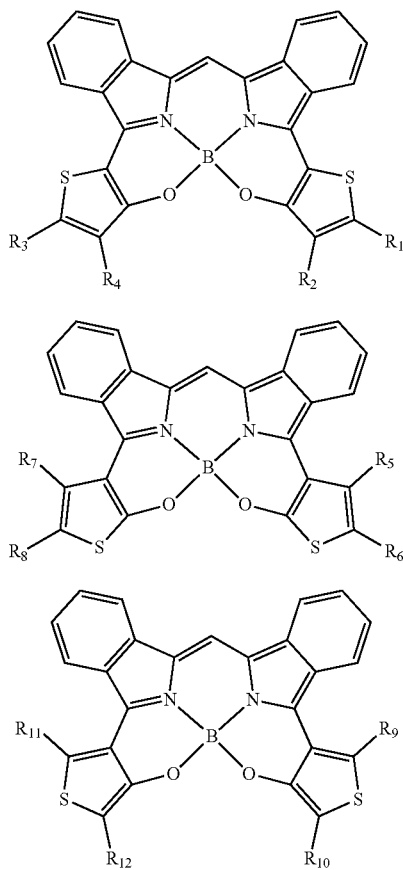

wherein $R_1$ to $R_{12}$ in the above formulae (2a), (2b) and (2c) each represent independently of one another a hydrogen atom, an alkyl group, an alkoxy group, an alkylthio group, an aromatic group, a halogen atom, a hydroxyl group, a mercapto group, a nitro group, a substituted amino group, an unsubstituted amino group, a cyano group, a sulfo group, an acyl group, a sulfamoyl group, an alkylsulfamoyl group, a carbamoyl group, or an alkylcarbamoyl group; and adjacent groups of $R_1$ to $R_{12}$ may be connected to each other to form a ring structure.

Specific examples of $R_1$ to $R_{12}$ in the above formulae (2a), (2b) and (2c) is analogous to the substituent $R_0$ in the above formula (1), and a preferable substituent is also analogous to this $R_0$. Although substituents $R_1$ to $R_{12}$ of the thiophene rings linked to 3 and 5-positions of BODIPY, respectively, may be the same as or different from each other; however, in terms of the synthesis, substituents present in the corresponding position on different thiophene rings is preferably the same as one another. In other words, in the above formula (2a), a structure where $R_1=R_3$ and $R_2=R_4$ is preferable, and $R_1=R_3=R_2=R_4$ is may be employed. In an analogous way, in the above formula (2b), a structure where $R_5=R_7$ and $R_6=R_8$ is preferable, and in the above formula (2c), a structure where $R_9=R_{11}$ and $R_{10}=R_{12}$ is preferable. In addition, among these structures, in terms of the delocalization of π electrons, formula (2a) has π conjugation linked to the entire thiophene ring, and therefore, the energy gap between HOMO and LUMO becomes smallest. From the above described reasons, the structure represented by the formula (2a) is most preferable.

A compound, which is one of the most preferable embodiments of the present invention, is represented by the above formula (2a).

Specific examples of $R_1$ to $R_4$ in the above formula (2a) are analogous to substituent $R_0$ in the above formula (1), and preferable substituent is also analogous to $R_0$. Substituents $R_1$ to $R_4$ of thiophene rings linked to 3 and 5-positions of BODIPY, respectively, may be the same as or different from each other; however, in terms of the synthesis, substituents present in the corresponding positions on different thiophene rings are preferably the same as one another. In other words, in the above formula (2a), a structure in which $R_1=R_3$ and $R_2=R_4$ is preferable.

Compounds (1-1) to (1-114) are shown below as specific examples of the compound represented by the above formula (1); however, the present invention is not limited to these. It is noted that the structural formulae shown as the specific examples are solely that illustrating one of the resonance structures, and is not limited to the illustrated resonance structures.

[Formula 6]

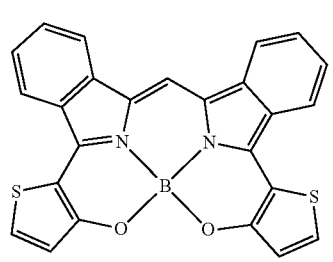
(1-1)

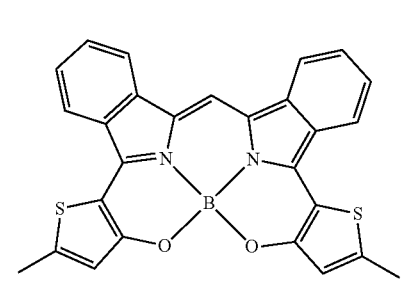
(1-2)

-continued
(1-3)
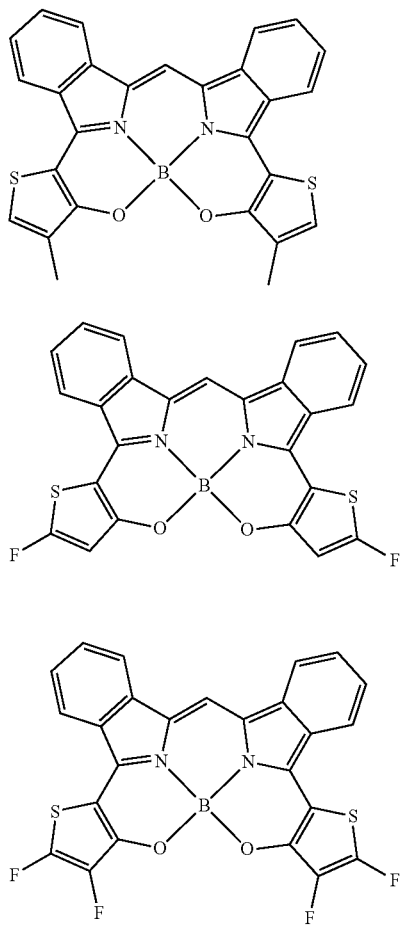
(1-4)
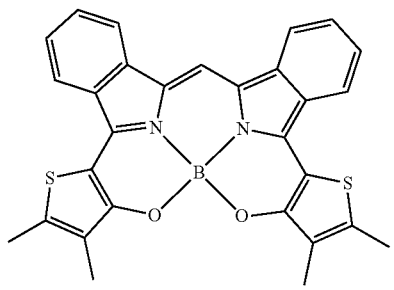
(1-5)
(1-6)
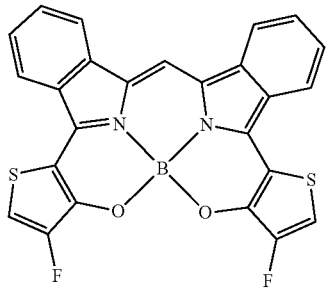
(1-7)
(1-8)
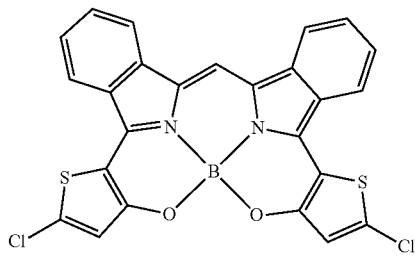
(1-9)
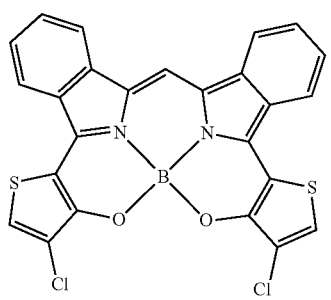
(1-10)
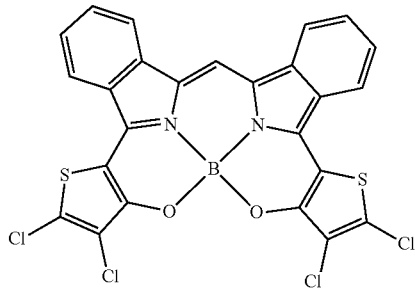
(1-11)
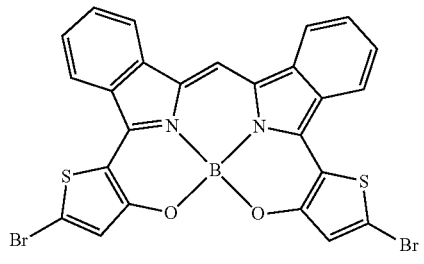
(1-12)
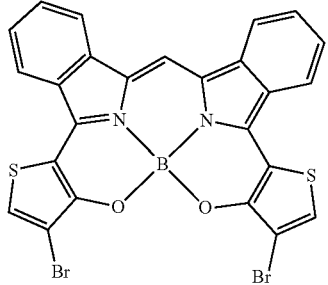

-continued
(1-13)
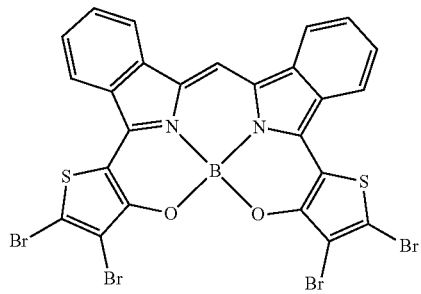
(1-14)
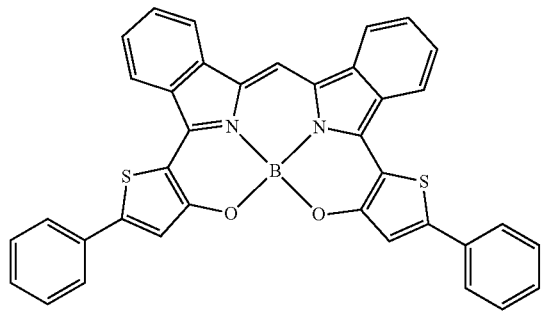
(1-15)
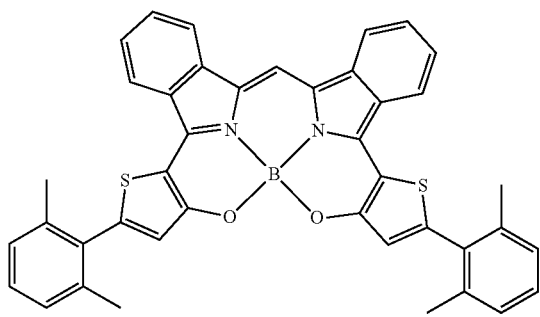
(1-16)
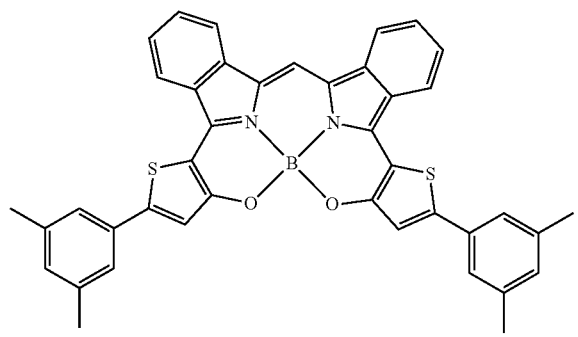
(1-17)
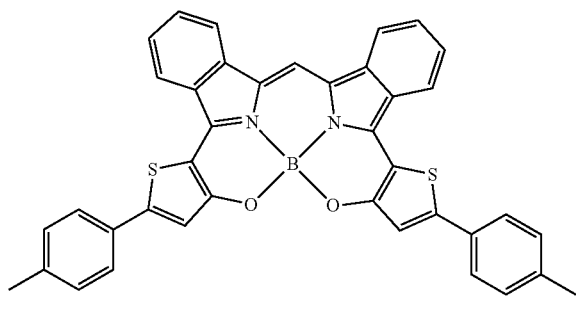
(1-18)
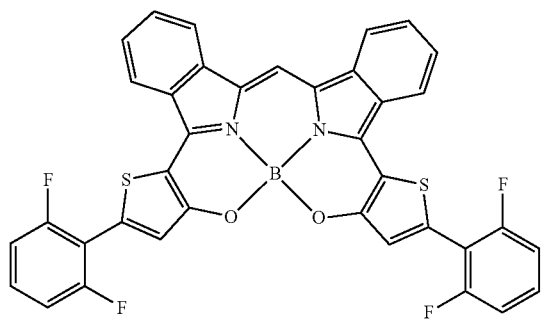
(1-19)
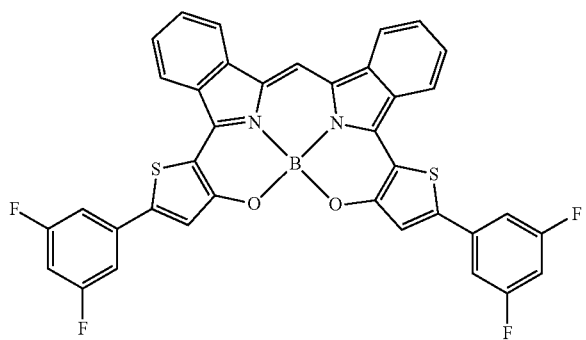
(1-20)
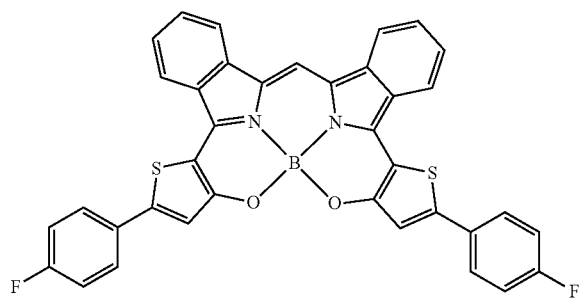

-continued
(1-21)
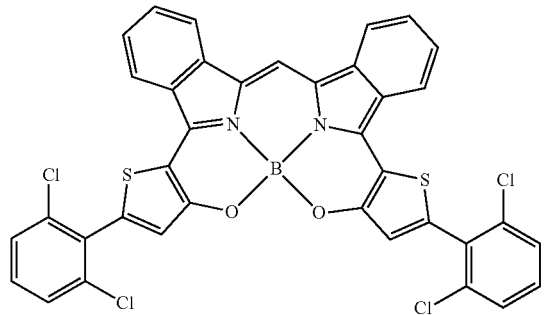
[Formula 7]
(1-22)
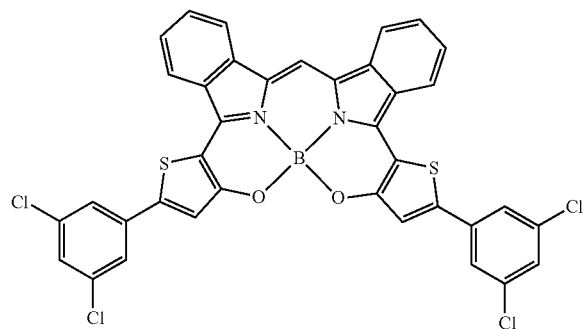
(1-23)
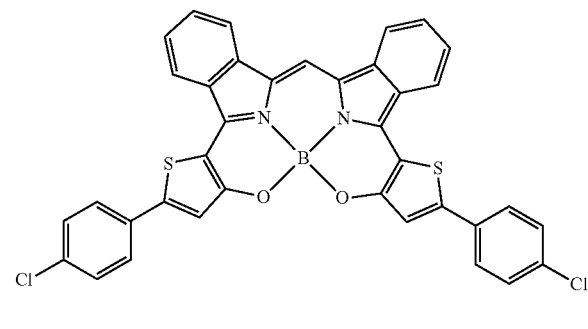
(1-24)
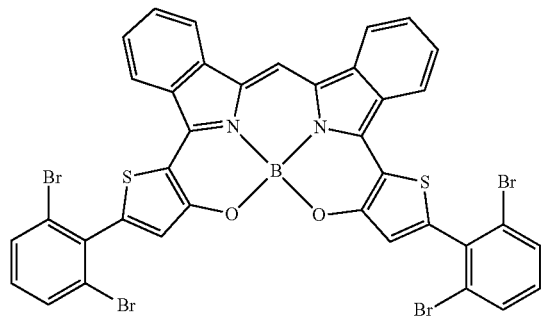
(1-25)
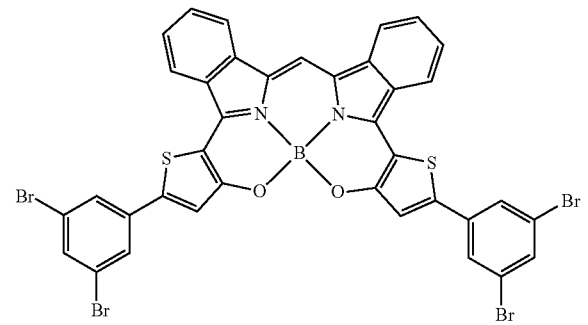
(1-26)
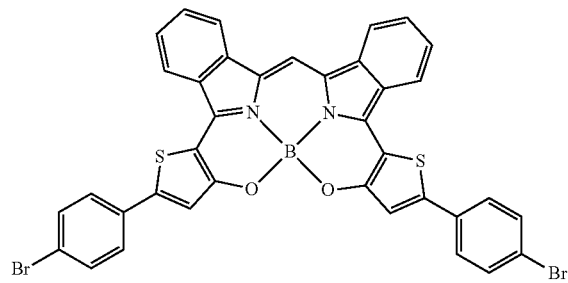
(1-27)
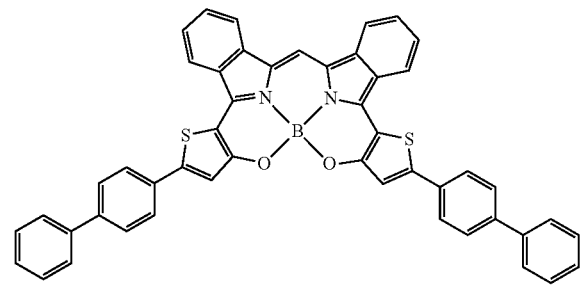

-continued
(1-28)
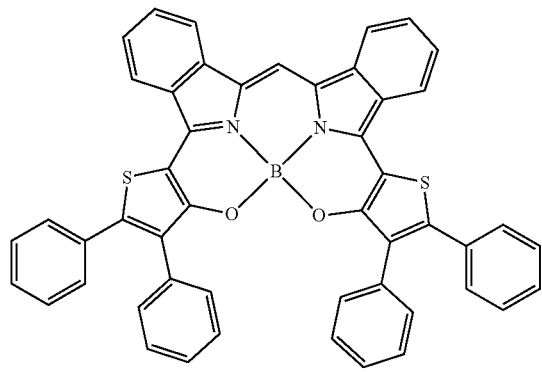
(1-29)
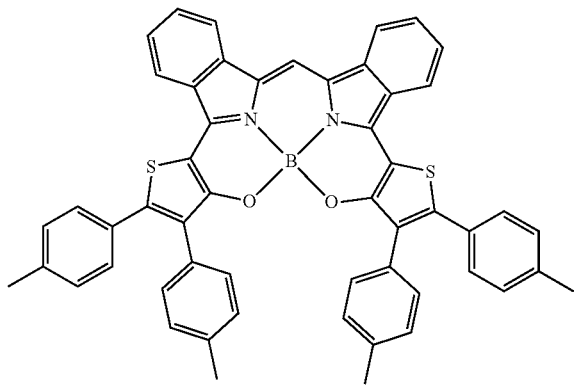
(1-30)
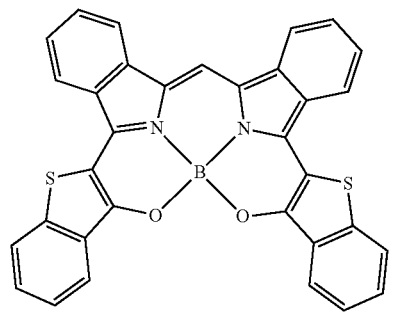
(1-31)
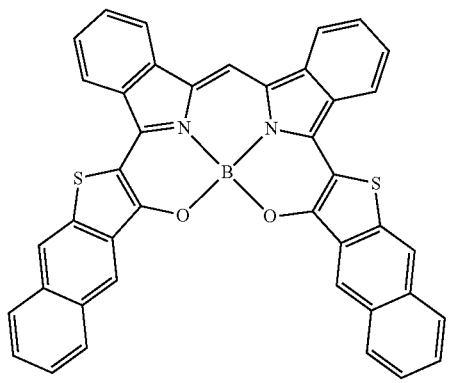
(1-32)
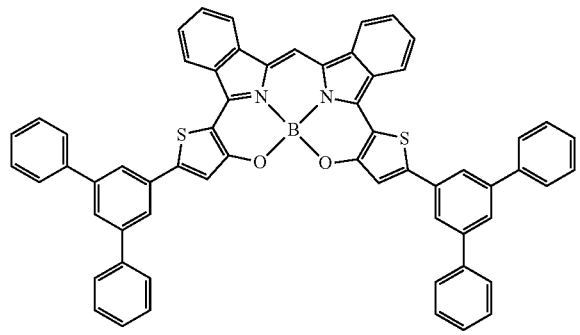
(1-33)
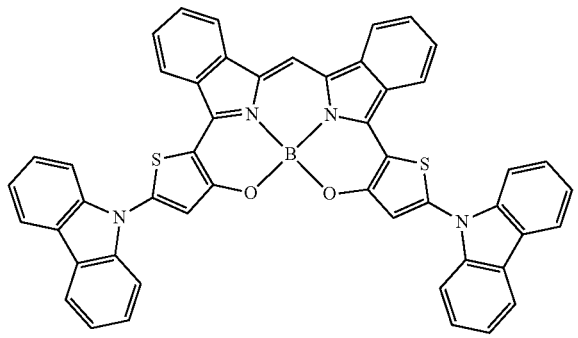
(1-34)
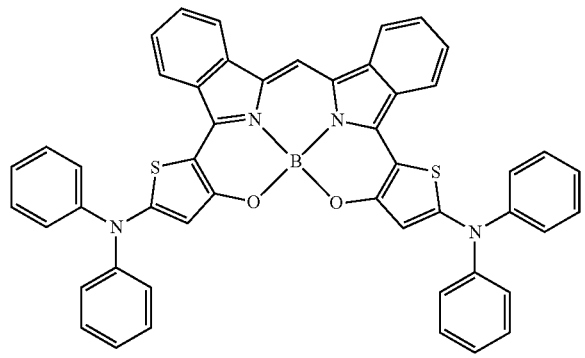
(1-35)
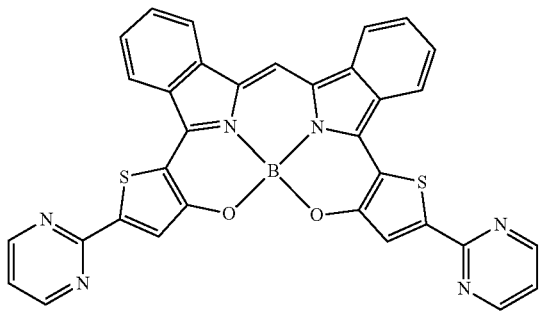

-continued
(1-36)
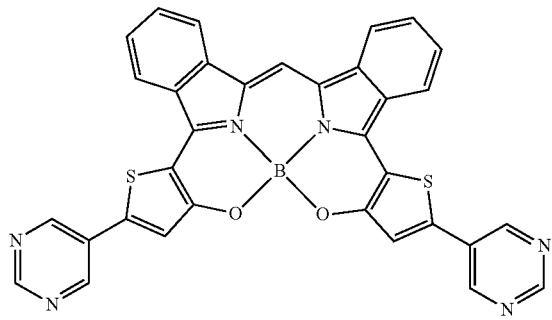
(1-37)
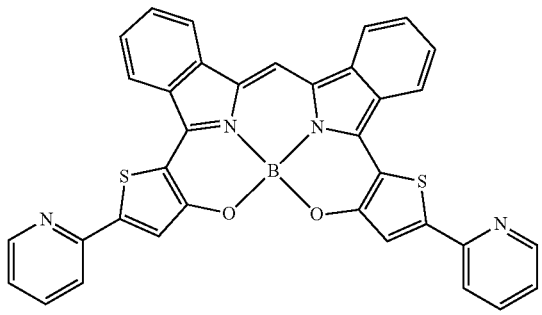
(1-38)
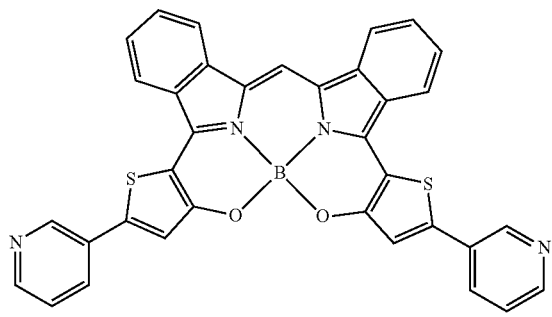
(1-39)
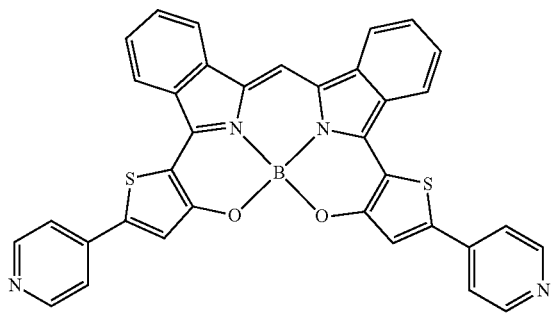
[Formula 8]
(1-40)
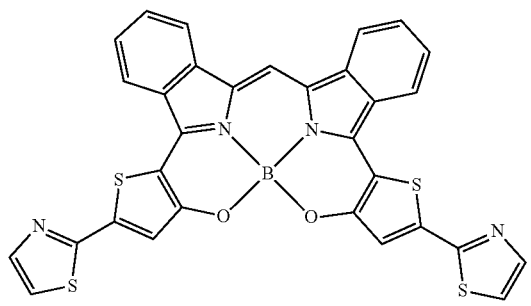
(1-41)
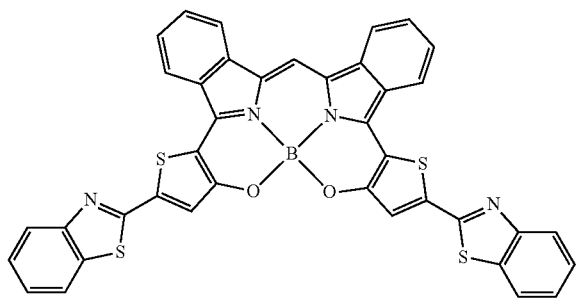
(1-42)
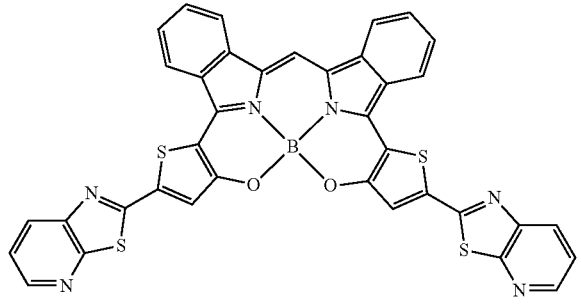
(1-43)
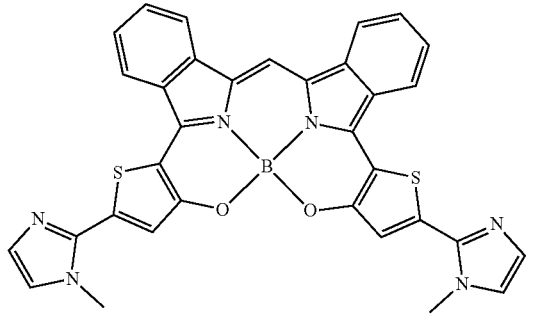

-continued
(1-44)
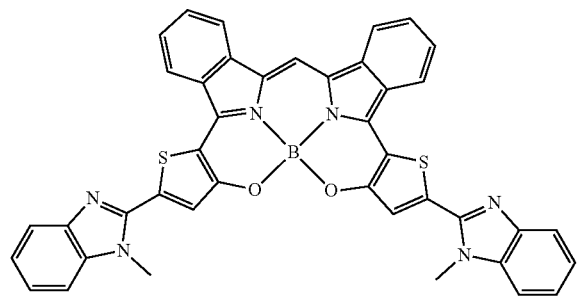
(1-45)
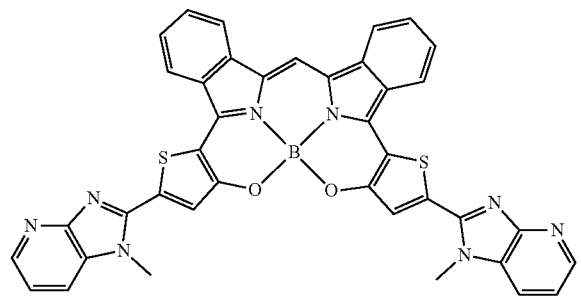
(1-46)
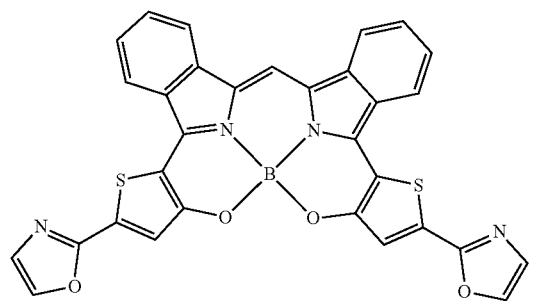
(1-47)
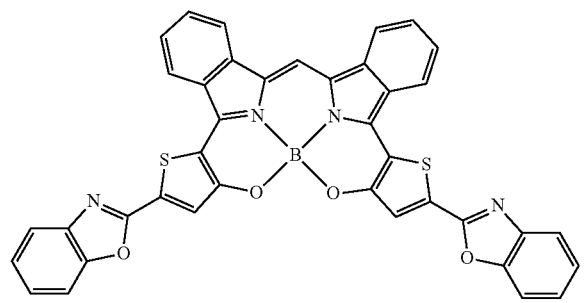
(1-48)
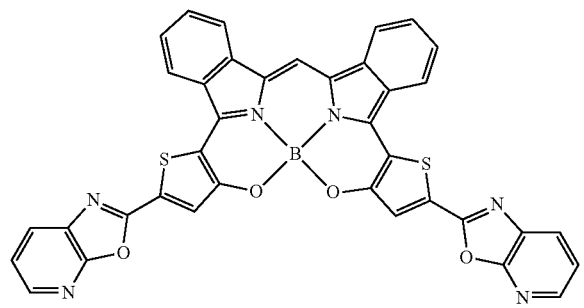
(1-49)
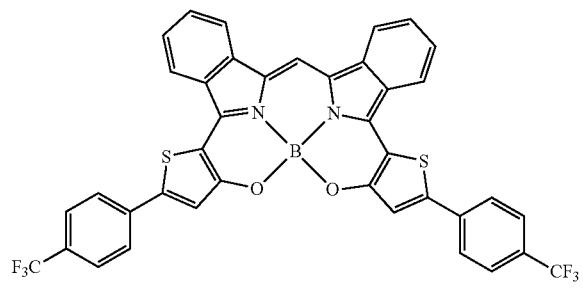
(1-50)
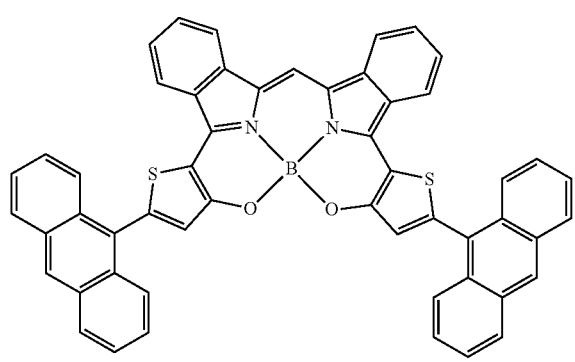
(1-51)
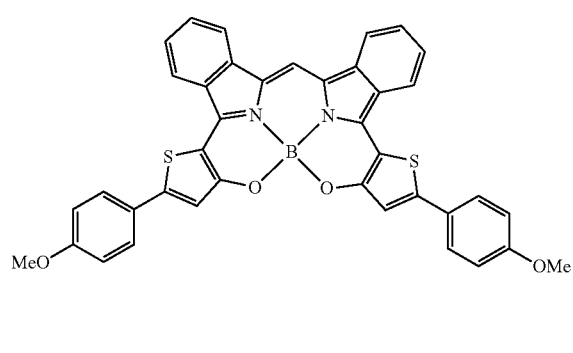

-continued
(1-52)
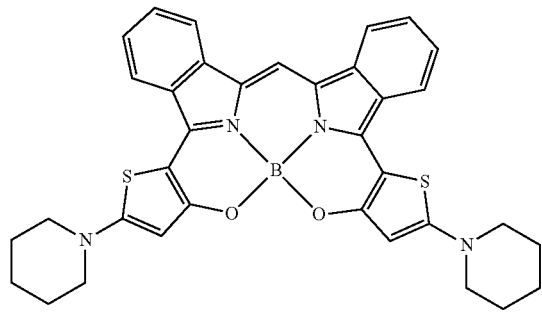
(1-53)
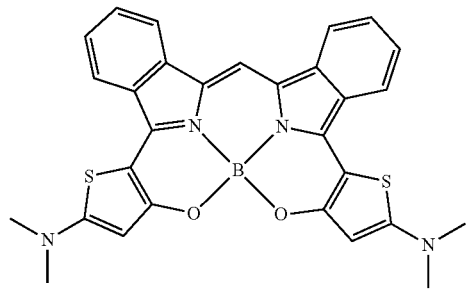
(1-54)
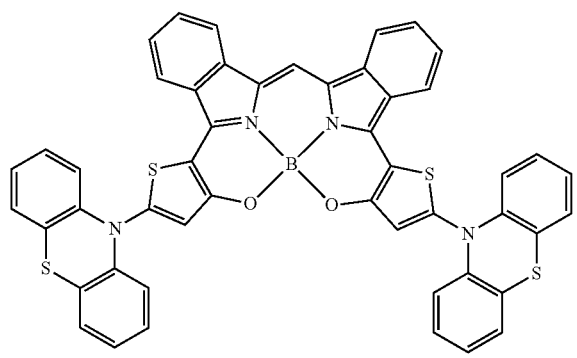
(1-55)
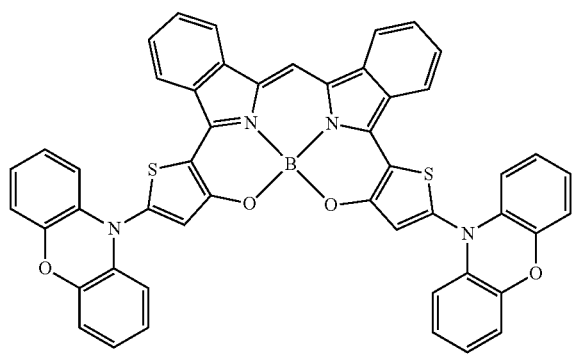
(1-56)
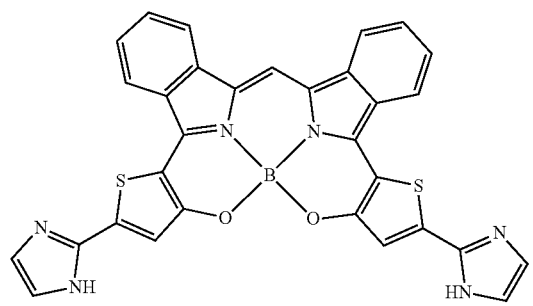
(1-57)
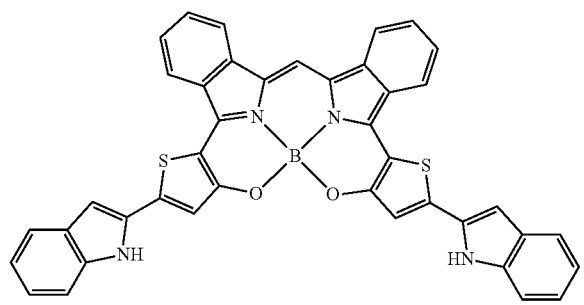
[Formula 9]
(1-58)
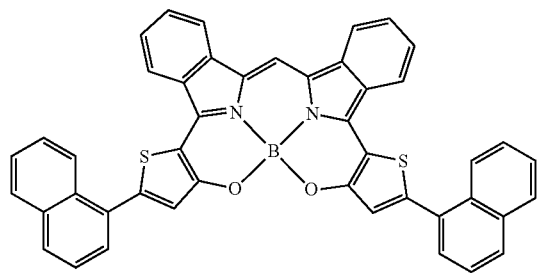
(1-59)
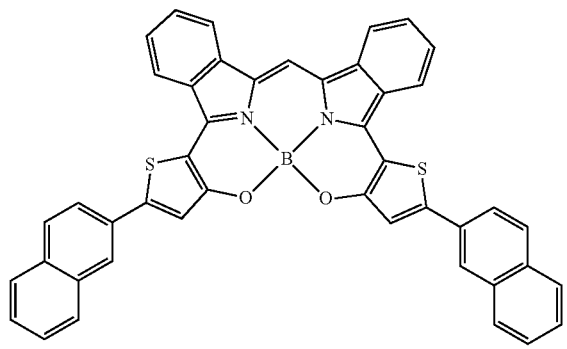

-continued
(1-60)
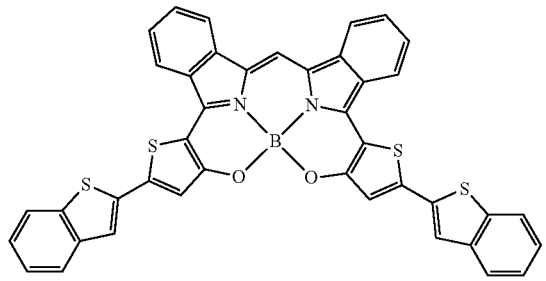
(1-61)
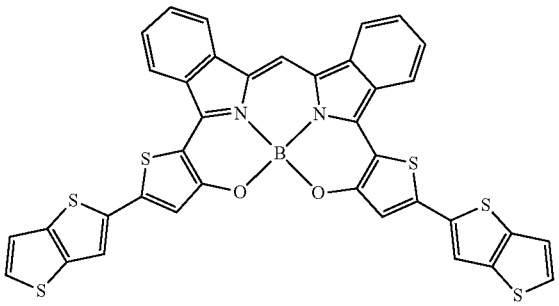
(1-62)
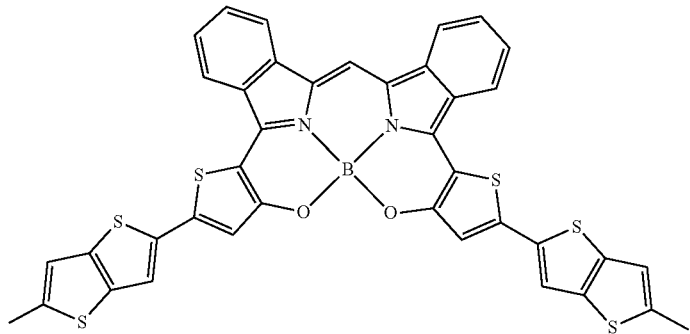
(1-63)
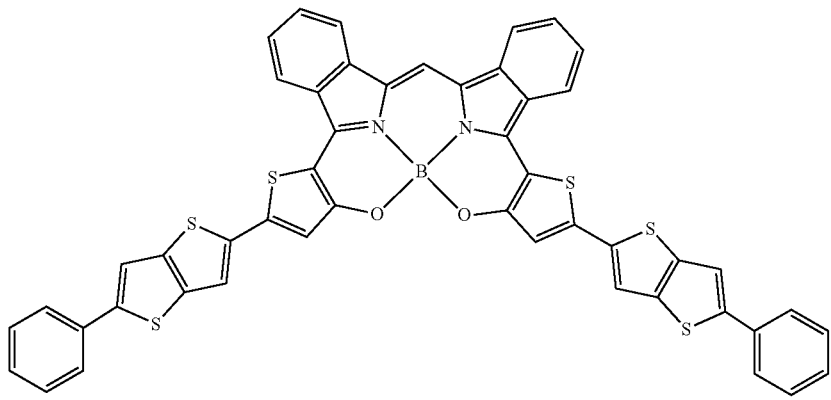
(1-64)
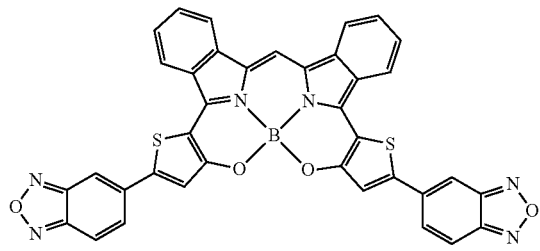
(1-65)
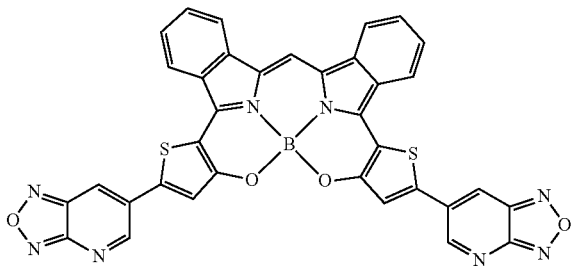

-continued
(1-66)
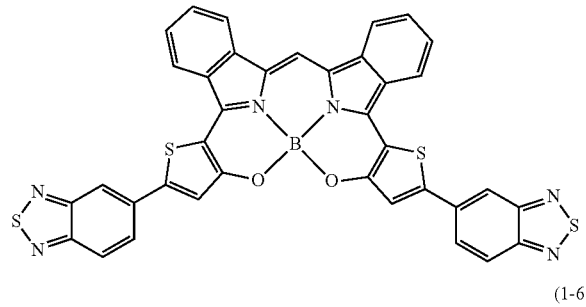
(1-67)
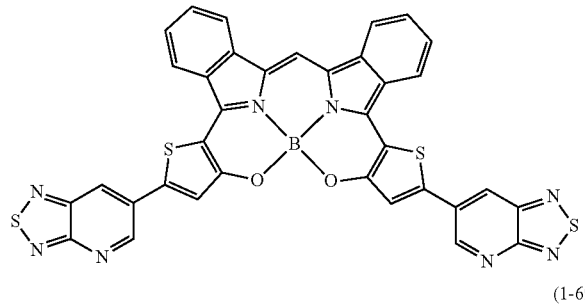
(1-68)
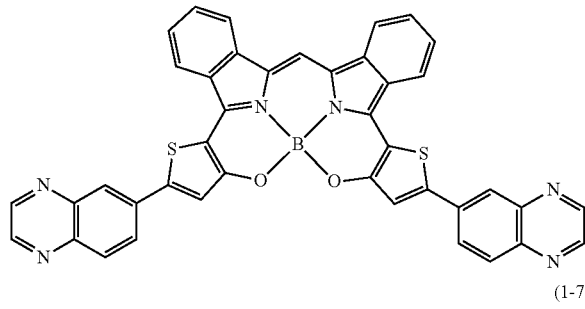
(1-69)
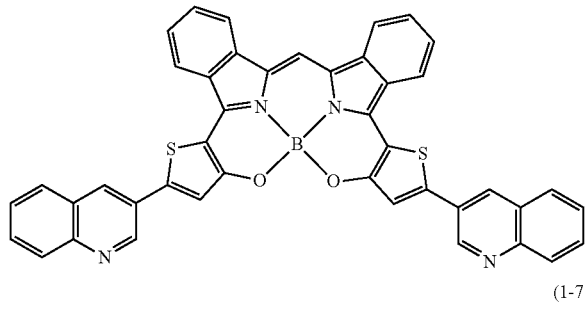
(1-70)
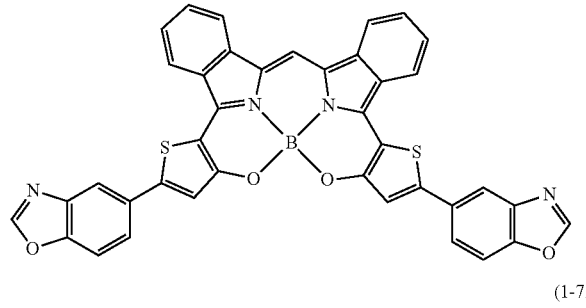
(1-71)
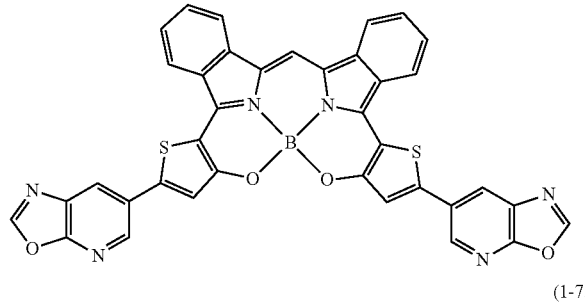
(1-72)
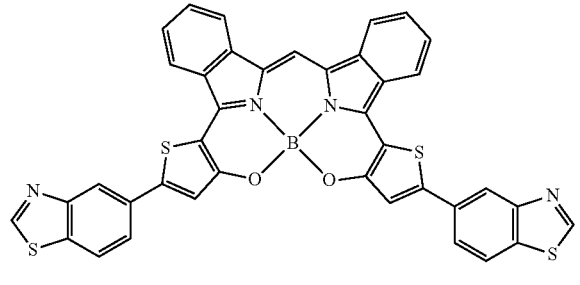
(1-73)
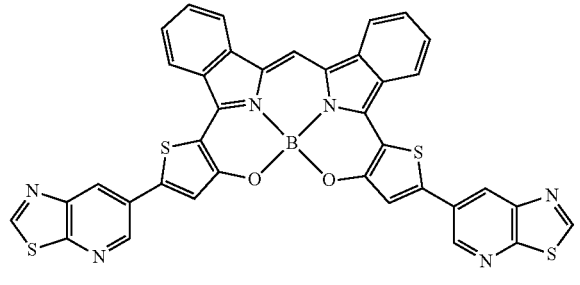
(1-74)
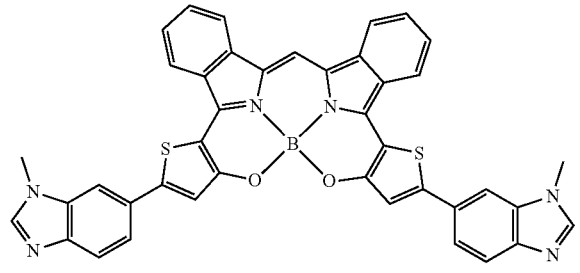
(1-75)
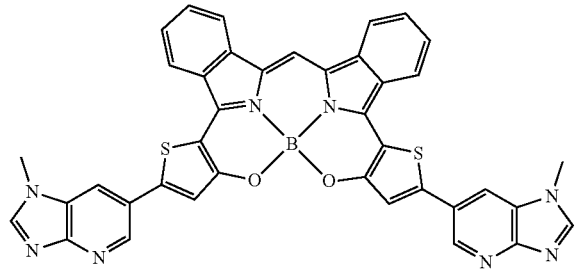

[Formula 10]
(1-76)
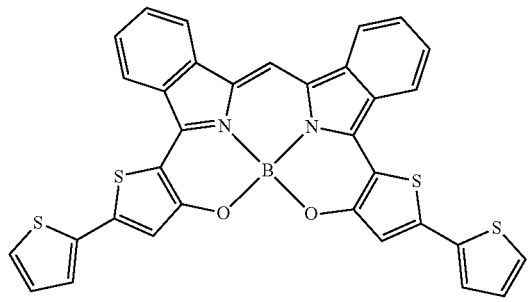
(1-77)
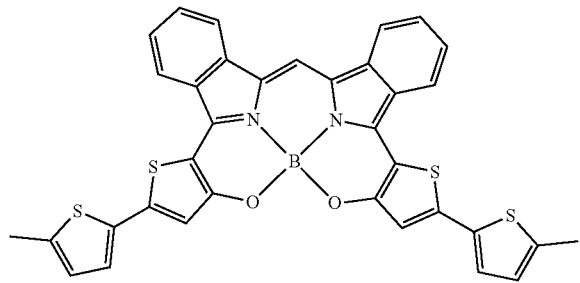
(1-78)
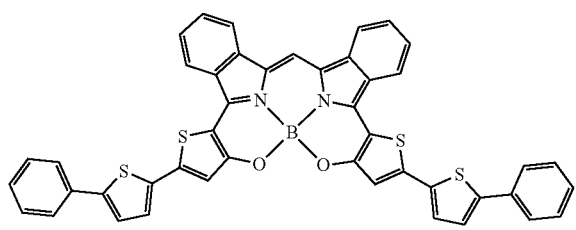
(1-79)
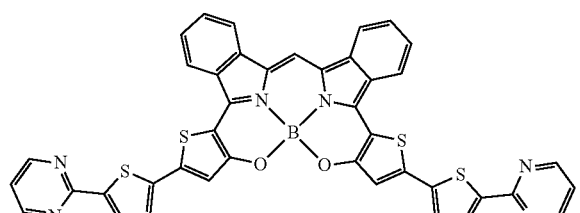
(1-80)
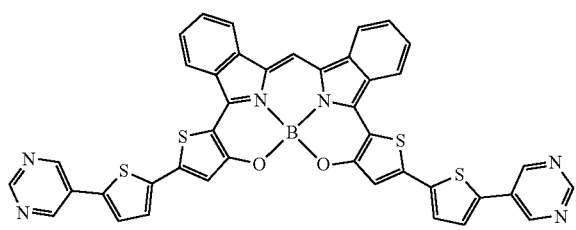
(1-81)
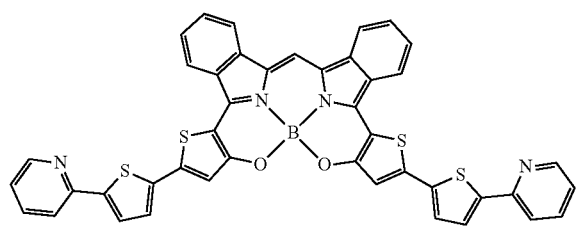
(1-82)
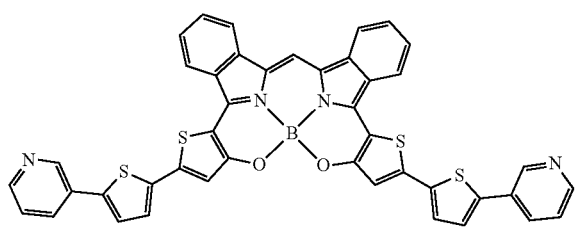
(1-83)
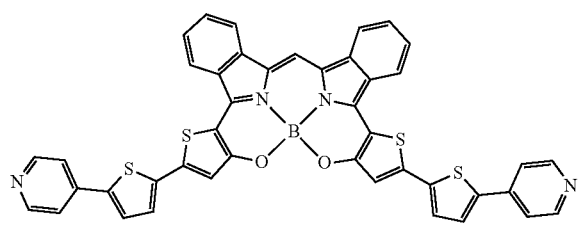
(1-84)
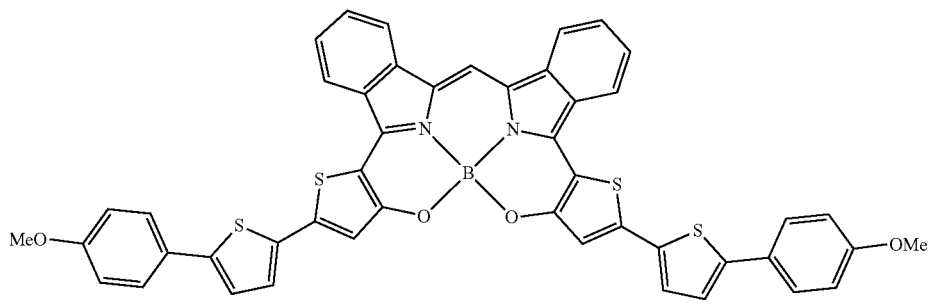

-continued
(1-85)
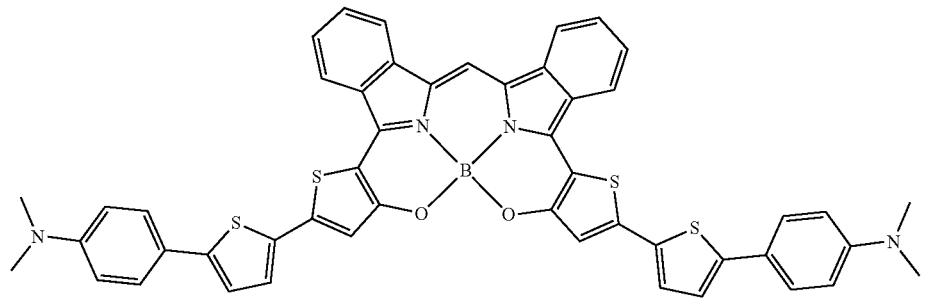
(1-86)
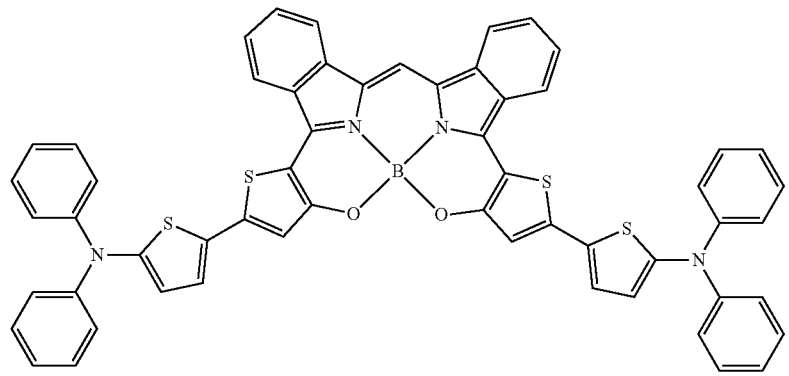
(1-87)
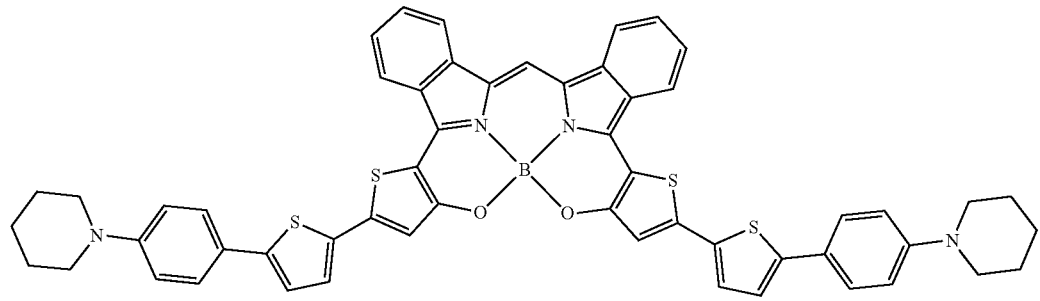
(1-88)
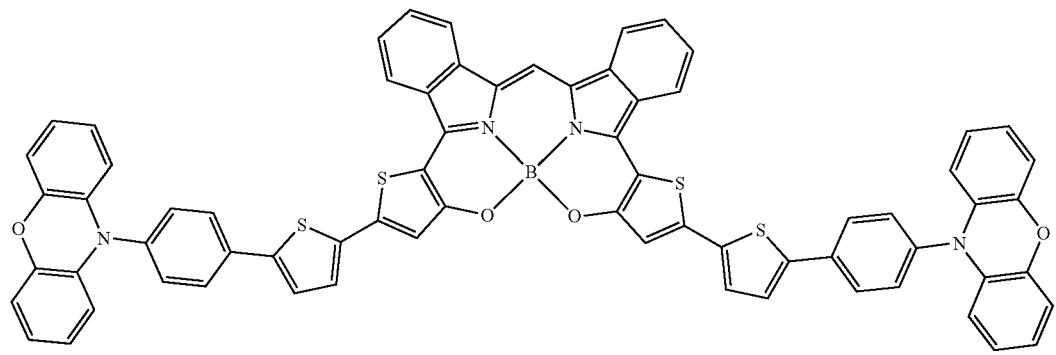

[Formula 11]
(1-89)
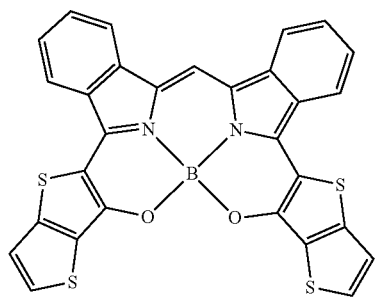
(1-90)
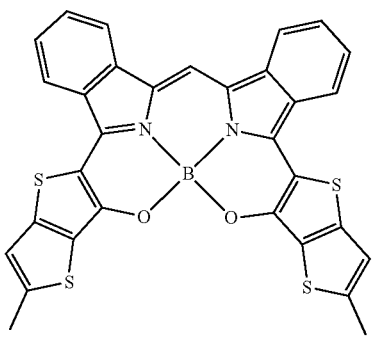
(1-91)
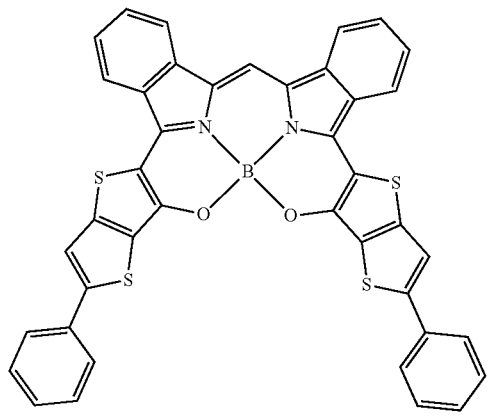
(1-92)
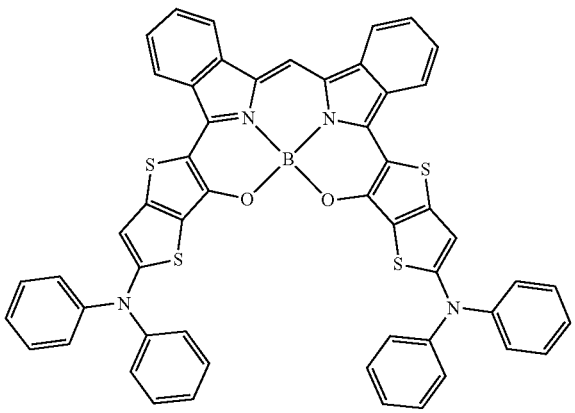
(1-93)
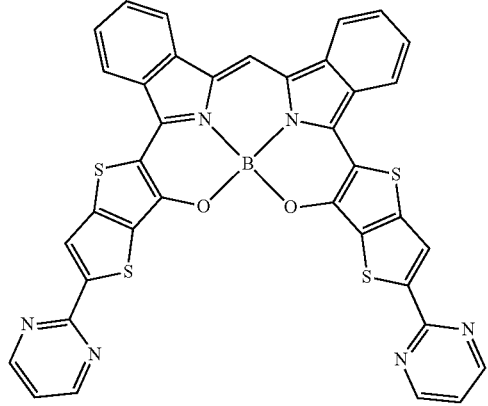
(1-94)
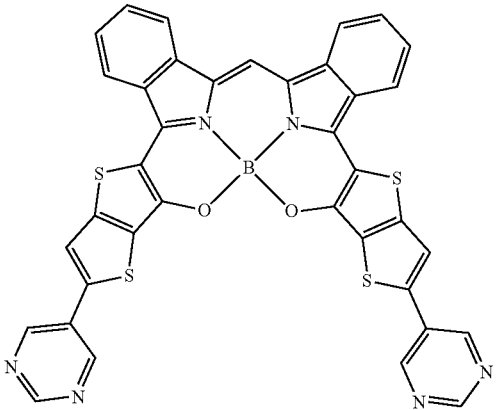
(1-95)
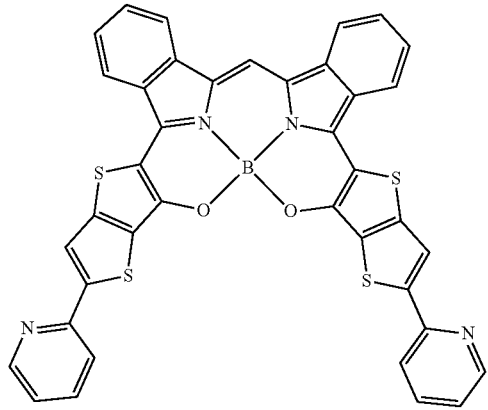
(1-96)
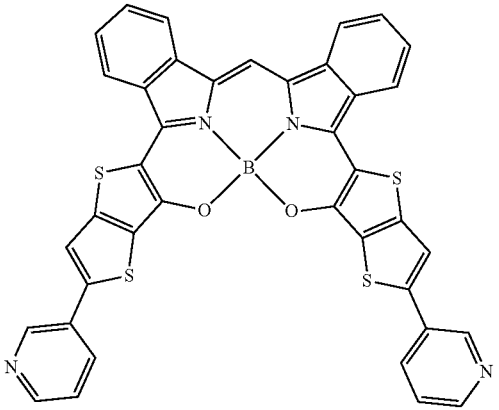

(1-97)
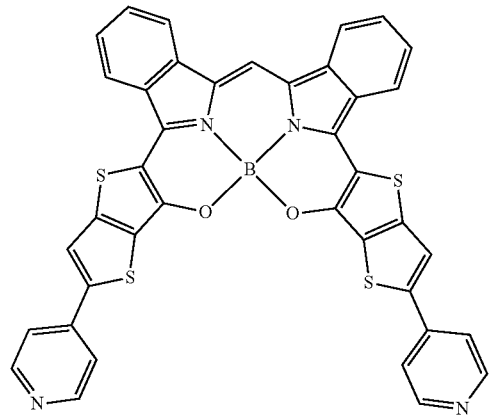
(1-98)
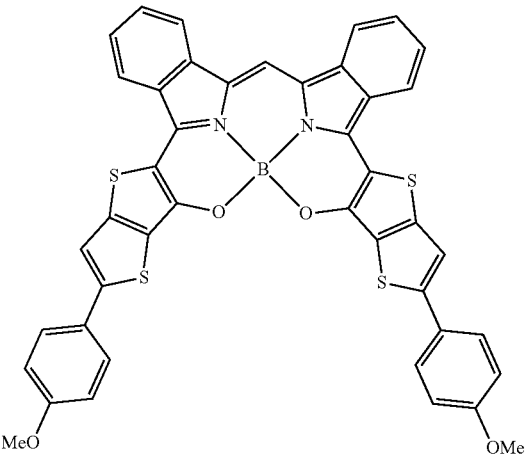
(1-99)
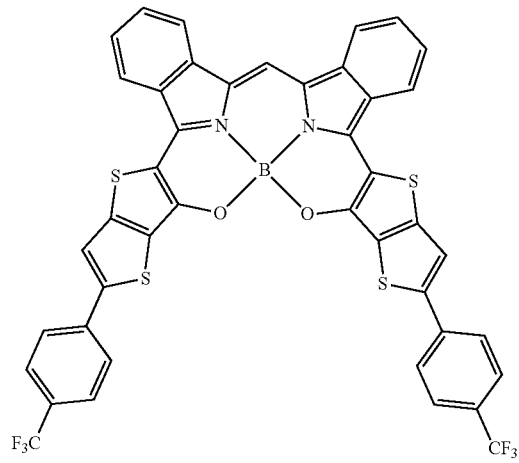
(1-100)
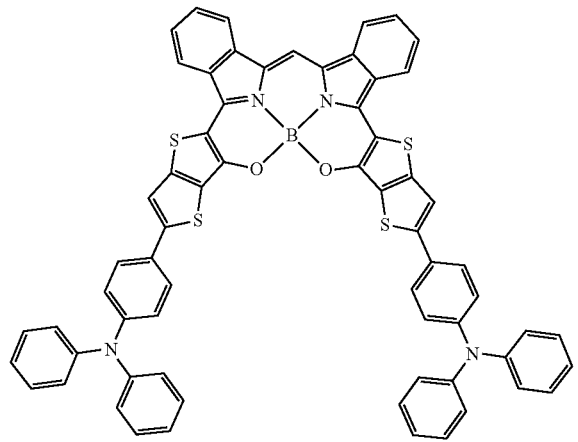
(1-101)
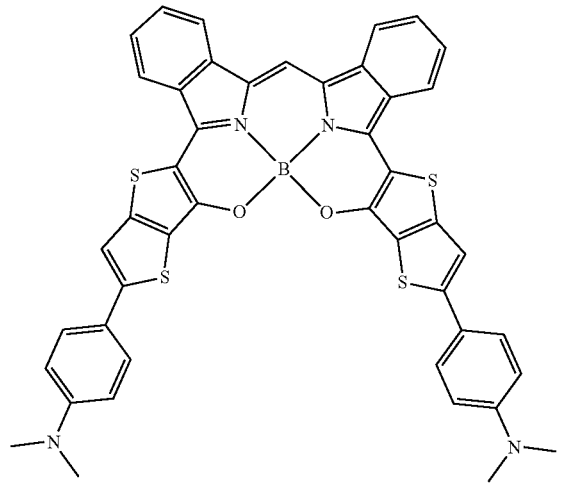
(1-102)
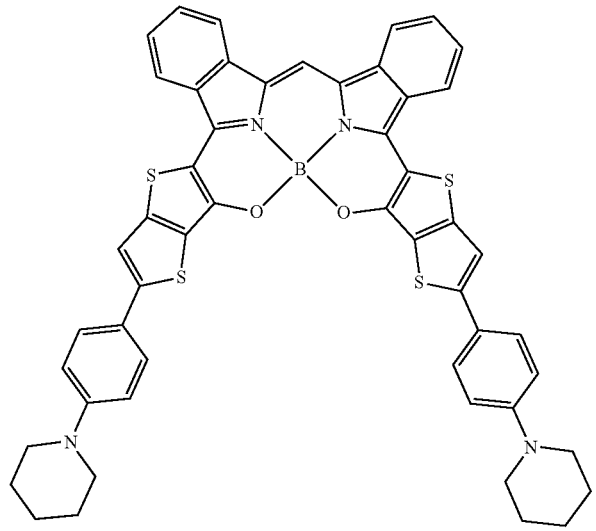

(1-103)
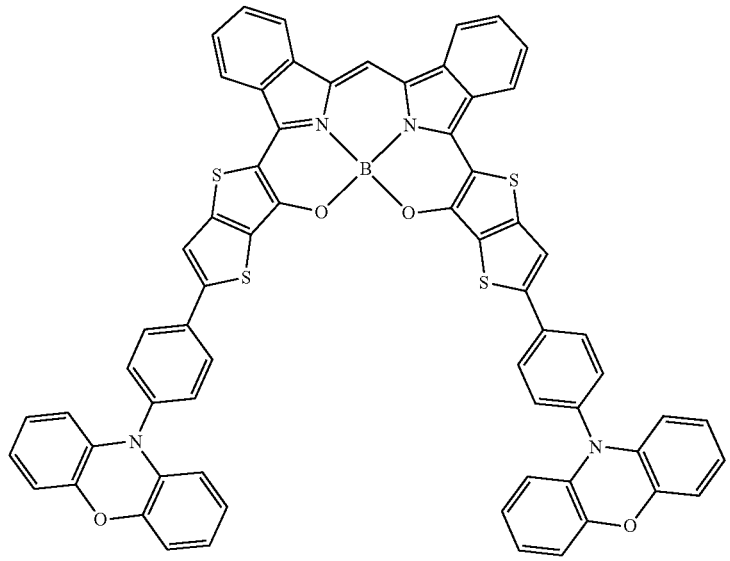
[Formula 12]
(1-104)
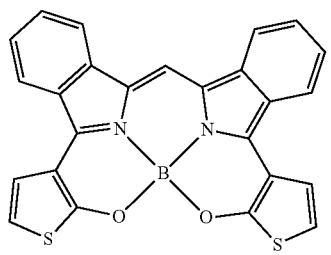
(1-105)
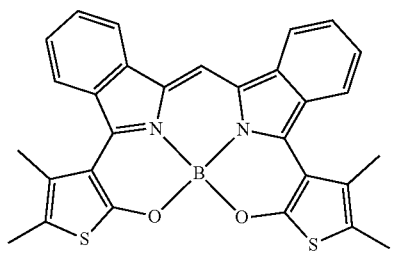
(1-106)
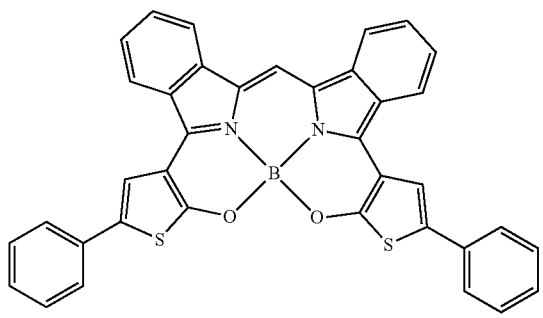
(1-107)
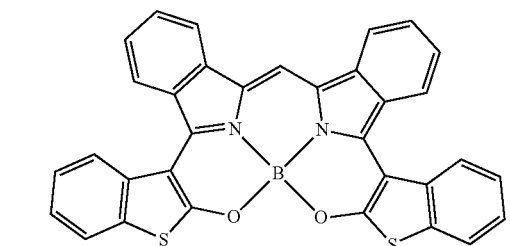
(1-108)
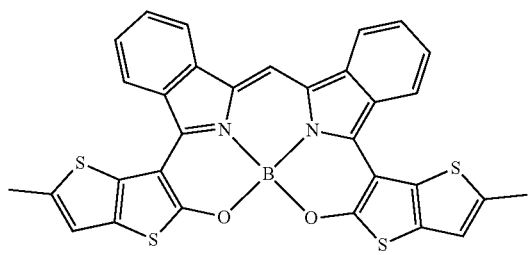
(1-109)
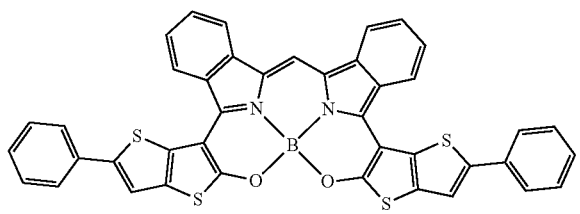

-continued (1-110)
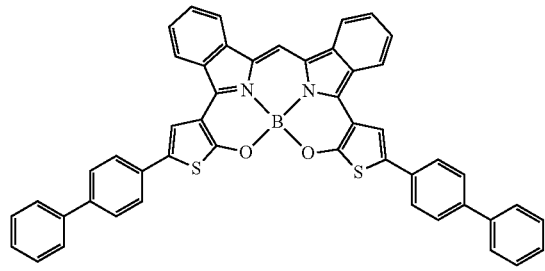

(1-111)
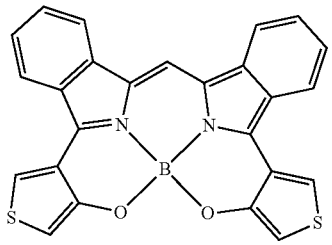

(1-112)
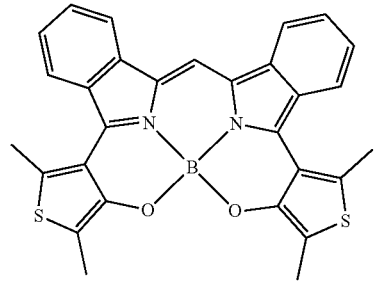

(1-113)
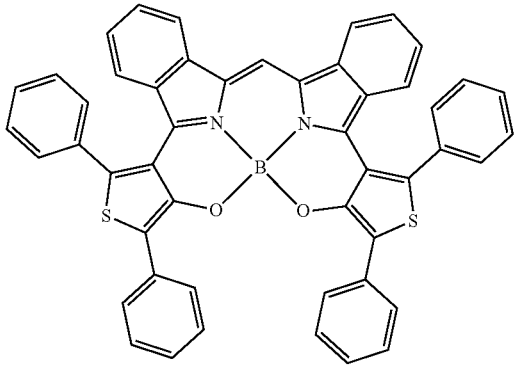

(1-114)
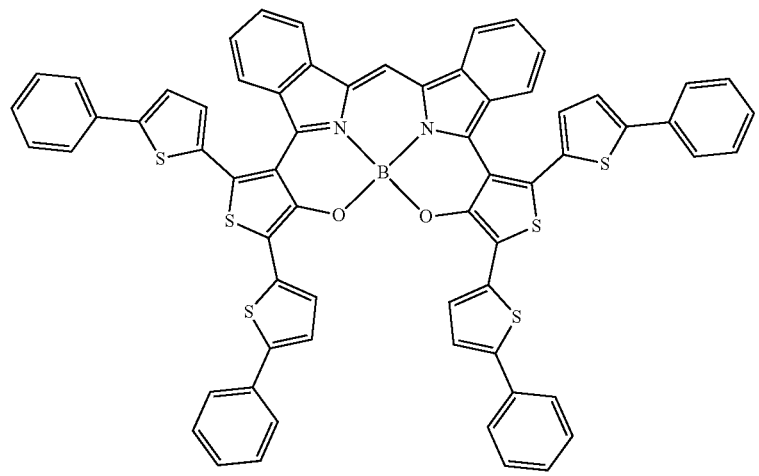

In a case where it is intended to utilize an organic layer including the compound represented by the formula (1) deposited by a vapor deposition method, the molecular weight of compound represented by the above formula (1) is, for example, preferably 1500 or less, more preferably 1200 or less, further preferably 1000 or less, and further more preferably 800 or less. The lower limit value of the molecular weight is a value of the minimum molecular weight that the formula (1) can take. It is noted that the compound represented by the formula (1) can be, independent of the molecular weight, deposited by an application method. The use of application method enables the deposition, even in the case of a compound with a relatively large molecular weight.

Next, a method for synthesizing a compound represented by the general formula (2a), which is one of the embodiments of the present invention, and in which $R_3$ is the same as $R_1$ and in which $R_4$ is the same as $R_2$, will be described in detail. The compound represented by the above formula (2a) can be synthesized by synthesis scheme shown below, for example. Dibenzopyrromethene boron chelate compound (compound 5) before B—O chelation can be synthesized with reference to a known method (RSC Adv., 2016, 6, 52180-52188). Then, compound 5 is reacted with boron tribromide to achieve B—O chelation. By a similar method, the compounds represented by the general formula (2b) and formula (2c) can be synthesized. A method for purifying these compounds is not limited in particular, and for example, washing, recrystallization, column chromatography, vacuum sublimation and the like can be employed, and as necessary, these methods may be combined.

[Formula 13]

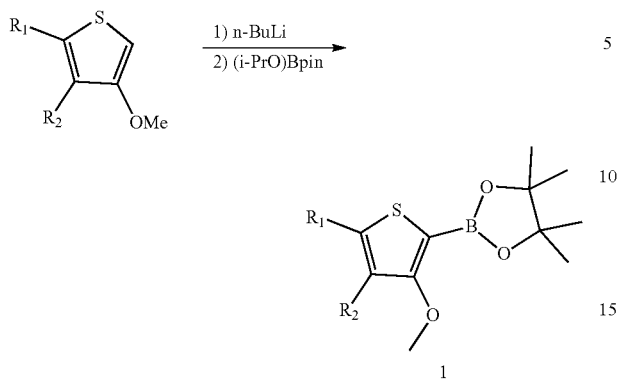

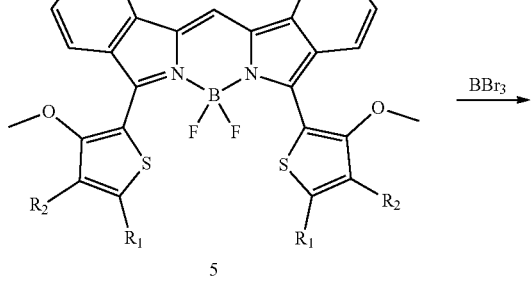

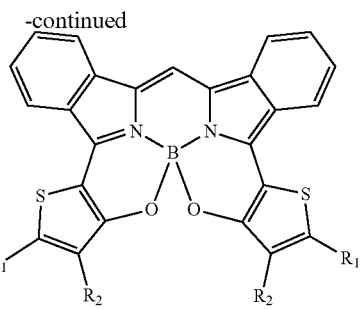

A thin film can be produced using a compound of the present invention. The thin film can be composed only of the compound of the present invention; however, the thin film may include an additional known near-infrared light absorbing dye. In order to absorb near-infrared light, the thin film is preferably an organic thin film absorbing light at 700 nm or more, more preferably absorbing light at 750 nm or more, and further preferably absorbing light at 800 nm or more. In other words, preferable absorption wavelength of the compound of the present invention is the same as the preferable absorption wavelength of the organic thin film. Therefore, $\lambda_{max}$ (maximum absorption wavelength) of the absorption spectrum within a range of 700 nm or more and 2500 nm or less of the compound of the present invention is preferably 750 nm or more, more preferably 850 nm or more. It is noted that an absorption spectrum herein means the results from the measurement using a chloroform solution of a compound represented by the formula (1), with an ultraviolet-visible spectrophotometer UV-1700 (SHIMADZU CORPORATION).

Examples of methods for forming a thin film of the present invention include typical dry deposition methods and wet deposition methods. Specifically included are resistance heating vapor deposition, which is a vacuum process, electron beam vapor deposition, sputtering, molecule stacking method, casting, which is a solution process, coating methods such as spin coating, dip coating, blade coating, wire bar coating and spray coating, printing methods such as ink jet printing, screen-printing, offset printing and anastatic printing, approaches of soft lithography such as microcontact printing method, and the like. With regard to a typical near-infrared light absorbing dye, processes such that the compound is applied in a solution state are desired in terms of processing easiness; however, an organic electronics device with stacked organic films is undesirable due to the fact that a solution to be applied may penetrate the organic film of the lower layer.

In order to achieve such a multi-layered stacked structure, it is suitable to use a vapor-depositable material, as in a dry deposition method, for example, vapor deposition by resistance heating. Therefore, a near-infrared light absorbing dye that has a main absorption wavelength in a near-infrared light region, and that can be vapor-deposited is preferable as a near-infrared photoelectric conversion material.

For the deposition of each layer, a method in which a plurality of the above approaches is combined may be employed. The thickness of each layer depends on the resistance value and the charge mobility of the substances in each layer, and therefore cannot be limited; however, the thickness of each layer is usually in a range of 0.5 to 5000 nm, preferably in a range of 1 to 1000 nm, more preferably in a range of 5 to 500 nm.

[Organic Electronics Device]

It is possible to produce an organic electronics device using a compound represented by the formula (1) of the present invention, a near-infrared light absorbing material or a near-infrared light emitting material, or an organic thin film including these. Examples of organic electronics devices include thin film transistors, organic photoelectric conversion devices, organic solar battery devices, organic electroluminescence devices (hereinbelow, referred to as "organic EL device" or "organic light-emitting device".), organic light emitting transistor devices, organic semiconductor laser devices, and the like. The present invention is directed to an organic photoelectric conversion device and an organic EL device, which are expected to be developed in particular near-infrared applications. Here, explanation will be given to a near-infrared organic photoelectric conversion device, an organic EL device using near-infrared light emission properties, and an organic semiconductor laser device with each of these being used as a near-infrared light absorbing material, which is one embodiment of the present invention. It is noted that without detailed explanation here, near-infrared light higher than 700 nm has high permeability with regard to living tissue. Therefore, due to the fact that the near-infrared light absorbing material can be utilized for the observation of living tissue, the near-infrared light absorbing material can be applied in various aspects with regard to pathological elucidation, diagnosis and the like in the medical field such as a near-infrared fluorescent probe, depending on the purposes.

[Organic Photoelectric Conversion Device]

A compound represented by the above formula (1) is a compound having near-infrared light absorption properties, and therefore, is expected to be utilized as a near-infrared organic photoelectric conversion device. In particular, the compound represented by formula (1) can be used in a photoelectric conversion layer in an organic photoelectric conversion device. In the device, the maximum absorption of the absorption band of response wavelength light to light is preferably 700 nm or more and 2500 nm or less. Here, examples of a near-infrared organic photoelectric conversion device include a near-infrared light sensor, an organic imaging device, a near-infrared light image sensor, and the like.

An organic photoelectric conversion device is a device in which a photoelectric conversion part is disposed between a pair of opposed electrode films, and in which light is incident on the photoelectric conversion part from above in relation to the electrode films. The photoelectric conversion part is a device which generates electrons and positive holes depending on the incident light, and the signals depending on the charge are read by a semiconductor, and which shows the amount of incident light depending on the absorption wavelength of the photoelectric conversion film part. In some cases, a readout transistor is connected to the electrode film in the side without light incidence. When photoelectric conversion devices are disposed as an array, these photoelectric conversion devices exhibits information about incidence position in addition to the amount of incident light, and therefore is an imaging device. In addition, in a case where the photoelectric conversion device disposed at a nearer place in relation to the light source does not block (transmits) the absorption wavelength of the photoelectric conversion device disposed at the behind in relation to the side of the light source, a plurality of photoelectric conversion devices can be used as a stack.

An organic photoelectric conversion device of the present invention can use a compound represented by the above formula (1) as a constituent material of the above photoelectric conversion part.

In many cases, the photoelectric conversion part consists of a photoelectric conversion layer, and one or more kinds of organic thin film layer other than the photoelectric conversion layer selected from a group consisting of electron transport layer, positive hole transport layer, electron block layer, positive hole block layer, crystallization preventing layer, a interlayer contact enhancing layer, and the like. A compound of the present invention can be used as layers other than the photoelectric conversion layer; however, these layers are preferably used as the organic thin film layer of the photoelectric conversion layer. Although the photoelectric conversion layer can be composed of the compound represented by the above formula (1), the photoelectric conversion layer may include a known near-infrared light absorbing material or others, in addition to the compound represented by the above formula (1).

In a case where a photoelectric conversion layer included in a photoelectric conversion part described below has positive hole transport ability, or in a case where an organic thin film layer other than the photoelectric conversion layer is a positive hole transport layer having positive hole transport ability, the electrode film used in the organic photoelectric conversion device of the present invention plays a role of gaining positive holes from the photoelectric conversion layer or other organic thin film layers and collecting these positive holes, and in addition, in a case where the photoelectric conversion layer included in the photoelectric conversion part has electron transport ability, or in a case where the organic thin film layer is an electron transport layer having electron transport ability, the electrode film plays a role of gaining and releasing electrons from the photoelectric conversion layer or other organic thin film layers and releasing these electrons. Therefore, material that can be used as an electrode film is not limited in particular, as long as the material has electrical conductivity to some extent; however, this material is preferably selected in terms of adhesiveness to adjacent photoelectric conversion layers or other organic thin film layers, electron affinity, ionization potential, stability, and the like. Examples of the material that can be used as the electrode film include conductive metal oxides such as tin oxide (NESA), indium oxide, indium tin oxide (ITO) and indium zinc oxide (IZO); metals such as gold, silver, platinum, chromium, aluminum, iron, cobalt, nickel and tungsten; inorganic conductive substances such as copper iodide and copper sulfide; conductive polymer such as polythiophen, polypyrrole and polyaniline; carbon, and the like. With regard to these materials, two or more of these materials can be mixed, or two or more of these materials may be stacked on two or more layers, as necessary. The electrical conductivity of the materials used in the electrode film is also not limited in particular, as long as the electrical conductivity does not inhibit the light reception of the photoelectric conversion device beyond necessity; however, the electrical conductivity as high as possible is preferable in terms of the signal intensity of the photoelectric conversion device and power consumption. For example, the ITO film having an electrical conductivity with a sheet resistance value of 300 ohms per square or less sufficiently functions as an electrode film; however, a commercially available product of a base plate that comprises ITO film having the electrical conductivity in the order of several ohms per square is available, and it is therefore desirable to use a base plate having such a high electrical conductivity. The thickness of the ITO film (electrode film) can be arbitrarily selected taking the electrical conductivity into consideration, and is usually in the order of 5 to 500 nm, preferably 10 to 300 nm. Examples of a method for forming an electrode film include conventionally known vapor deposition methods, electron beam methods, sputtering methods, chemical reaction methods and application methods, and the like. The electrode film disposed on the base plate may be subjected to UV-ozone treatment, plasma treatment and the like, as necessary.

Among the electrode films, examples of materials of the transparent electrode film used in the electrode film in the side on which at least a portion of light is incident include ITO, IZO, $SnO_2$, ATO (antimony doped tin oxide), ZnO, AZO (Al doped zinc oxide), GZO (gallium doped zinc oxide), $TiO_2$, FTO (fluorine doped tin oxide), and the like. The transmittance of light that has accomplished the incidence through the transparent electrode film at the absorption peak wavelength of the photoelectric conversion layer is preferably 60% or more, more preferably 80% or more, and particularly preferably 95% or more.

In addition, in case of stacking a plurality of photoelectric conversion layers that differ in wavelength to be detected, the electrode films used between the respective photoelectric conversion layers (These electrodes film are electrode films other than the pair of the electrode films described above.) are required to transmit light within a wavelength other than light detected by the respective photoelectric conversion layers, and in the electrode film, it is preferable to use a material that transmits 90% or more of the incident light, and it is more preferable to use a material that transmits 95% or more of light.

It is preferable to produce electrode films by a plasma free method. By producing these electrode films by a plasma free method, the influence of plasma on the base plate on which the electrode film is to be disposed is reduced, so that the photoelectric conversion properties of the photoelectric conversion device can be better. Here, plasma free means a state so that plasma is not generated during the deposition of the electrode film, or a distance from a plasma source to a base plate is 2 cm or more, preferably 10 cm or more, further preferably 20 cm or more to reduce plasma that reaches a base plate.

Examples of an apparatus which does not involve the generation of plasma during the deposition of an electrode film include electron beam vapor deposition apparatus (EB vapor deposition apparatus), pulsed laser vapor deposition apparatus, and the like. A method for depositing a transparent electrode film using an EB vapor deposition apparatus is referred to as an EB vapor deposition method, and a method for depositing a transparent electrode film using a pulsed laser vapor deposition apparatus is referred to as a pulsed laser vapor deposition method.

As an apparatus enabling a state in which plasma can be reduced during the deposition (hereinbelow, referred to as a plasma free deposition apparatus.), a facing target sputtering apparatus, arc plasma vapor deposition apparatus and the like can be considered, for example.

In a case where the transparent conductive film is an electrode film (for example, a first conductive film), DC short circuit, or increase in the leakage current may occur. One of the causes of this is believed to be due to the fact that fine cracks occurred in the photoelectric conversion layer are covered by a dense film such as TCO (Transparent Conductive Oxide), and conduction to the electrode film in the side opposite to the transparent conductive film is increased.

Therefore, in case where a material with a poorer film quality such as Al is used in the electrode, it tends not to occur the increase in the leakage current. The film thickness of the electrode film is controlled depending on the film thickness of the photoelectric conversion layer (the depth of the crack), so that the increase in the leakage current can be suppressed.

In general, when the conductive film becomes thinner than a predetermined value, the increase in the rapid resistance value occurs. However, the sheet resistance of the conductive film in the photoelectric conversion device for a light sensor of the present embodiment is usually 100 to 10000 ohms per square, and the flexibility of the film thickness is great. In addition, the thinner the transparent conductive film, the smaller the amount of light to be absorbed, and in general, the transmittance of light become higher. When the transmittance of light becomes high, this is very preferable due to the fact that light absorbed in the photoelectric conversion layer is increased to improve photoelectric conversion ability.

The photoelectric conversion part possessed by the organic photoelectric conversion device of the present invention may include the photoelectric conversion layer and an organic thin film layer other than the photoelectric conversion layer. In general, an organic semiconductor film is used in the photoelectric conversion layer that constitutes the photoelectric conversion part; however, the organic semiconductor film may be one layer or a plurality of layers, and in a case where the organic semiconductor film is one layer, p type organic semiconductor film, n-type organic semiconductor film, or a mixed film of these (bulk hetero structure) is used. On the other hand, in a case where the organic semiconductor film is a plurality of layers, the number of the films is in the order of 2 to 10 layer, the structure is a stack of any of p type organic semiconductor film, n-type organic semiconductor film or a mixed film thereof (bulk hetero structure), and a buffer layer may be inserted between the layers. It is noted that in a case where the photoelectric conversion layer is formed by the above mixed film, it is preferable to use a compound represented by the general formula (1) of the present invention as a p type semiconductor material, and to use typical fullerenes or fullerene derivatives as an n-type semiconductor material.

In the organic photoelectric conversion device of the present invention, an organic thin film layer other than a photoelectric conversion layer that constitutes a photoelectric conversion part can also be used as layers other than the photoelectric conversion layer, for example, an electron transport layer, a positive hole transport layer, an electron block layer, a positive hole block layer, a crystallization preventing layer, a interlayer contact improving layer, or the like. By using the organic thin film layer as one or more kinds of layers selected from a group consisting of, in particular, electron transport layers, positive hole transport layers, electron block layers and positive hole block layers (hereinbelow, also referred to as "carrier block layer".), a device that achieves the efficient convertion to electrical signals at low light energy can be obtained, and this is preferable.

In addition, for example, the organic imaging device is required to reduce dark current, typically for the sake of typically high contrast or power saving, and therefore, an approach to insert a carrier block layer in the layer structure is preferable. These carrier block layers typically are used in the field of organic electronics devices, and have a function of controlling the back migration of positive holes or electrons in the constituent film of each device.

An electron transport layer plays a role of transporting electrons generated in a photoelectric conversion layer to an electrode film, as well as a role of preventing migration of positive holes from the electrode film, which is an electron transport destination, to a photoelectric conversion layer. A positive hole transport layer plays a role of transporting the generated positive holes from the photoelectric conversion layer to the electrode film, as well as a role of preventing the migration of electrons from the electrode film, which is a positive hole transport destination to the photoelectric conversion layer. An electron block layer plays a role of preventing the migration of electrons from the electrode film to the photoelectric conversion layer, avoiding recombination in the photoelectric conversion layer, and reducing the dark current. The positive hole block layer has a function of preventing the migration of electrons from the electrode film to the photoelectric conversion layer, avoiding the recombination in the photoelectric conversion layer, and reducing the dark current.

A representative device structure of an organic photoelectric conversion device of the present invention is show in FIG. 1; however, the present invention is not limited to this structure. In an exemplary aspect of FIG. 1, 1 represents insulation, 2 represents one electrode film, 3 represents an electron block layer, 4 represents a photoelectric conversion layer, 5 represents a positive hole block layer, 6 represents the other electrode film, and 7 represents an insulation substrate or other photoelectric conversion device, respectively. A readout transistor is not depicted in FIG. 1; however, there is no problem as long as the readout transistor is connected to the electrode film of 2 or 6, and in addition, if the photoelectric conversion layer 4 is transparent, the readout transistor may be deposited on the outside of the electrode film opposite to the side of light incidence. The incidence of light into the organic photoelectric conversion device may be from either of an upper part or a lower part, as long as components other than a photoelectric conversion layer 4 do not extremely inhibit light incidence within the main absorption wavelength of the photoelectric conversion layer 4.

[Organic EL Device]

Next, organic EL device will be explained.

A compound of the present invention represented by the general formula (1) is a compound having near-infrared light emission properties, and therefore, is expected to be utilized as an organic EL device.

An organic EL device is a solid and is of interest for use in applications such as self-luminous large area color display and illumination, and many developments have been made. Known configurations of the organic EL device are a configuration having a structure in which two layers, i.e., a light emission layer and a charge transport layer are provided between opposed electrodes consisting of a negative electrode and a positive electrode; a configuration having a structure having three layers, i.e., an electron transport layer, a light emission layer and a positive hole transport layer stacked between opposed electrodes; and a configuration having three or more layers; and the like, and in addition, also known is a configuration in which the light emission layer is a single layer, and the like.

Here, a positive hole transport layer has a function of injecting positive holes from a positive electrode, transporting positive holes to light emission layer, and facilitating the injection of positive holes into a light emission layer, as well as a function of blocking electrons. In addition, an electron transport layer has a function of transporting electrons to the light emission layer by the injection of the electrons from the negative electrode to facilitate injection of electrons into the light emission layer, as well as a function of blocking positive holes. In addition, the light emission layer produces excitons by the recombination of the injected each electron and each positive hole, and the excitons have a function of emitting light during a process of radiative deactivation. Hereinbelow, a preferable aspect of an organic EL device is described.

A preferable organic EL device is a device in which an organic thin film as one layer or a plurality of layers is formed between the positive electrode and the negative electrode, and which emits light by electrical energy.

The positive electrode that can be used in such an organic EL device is an electrode that has a function of injecting positive holes into a positive hole injection layer, a positive hole transport layer, and light emission layer. The positive electrode material is not limited in particular; however, metal oxides, metals, alloys, conductive materials and the like with a typical work function of 4.5 eV or more is suitable.

Specifically included are conductive metal oxides such as tin oxide (NESA), indium oxide, indium tin oxide (ITO) and indium zinc oxide (IZO), metals such as gold, silver, platinum, chromium, aluminum, iron, cobalt, nickel and tungsten, inorganic conductive substances such as copper iodide and copper sulfide, conductive polymers such as polythiophen, polypyrrole and polyaniline, and carbon. Among these, it is preferable to use ITO or NESA.

The positive electrode can use a plurality of materials, or may be composed of two or more layers, if necessary. The resistance of the positive electrode is not limited, as long as the resistance enables the supply of electric current enough for the light emission of the device; however, the resistance is preferably a low resistance in terms of the power consumption of the device. For example, if the ITO base plate has a sheet resistance value of 300 ohms per square or less, the ITO base plate functions as a device electrode; however, a base plate in the order of several ohms per square is also available, and it is therefore desirable to use the low resistance product. The thickness of ITO can be arbitrarily selected depending on the resistance value, and is usually used from 5 to 500 nm, preferably 10 to 300 nm. Examples of a method for forming a positive electrode film such as ITO include vapor deposition method, electron beam method, sputtering method, chemical reaction method, application method, and the like.

The negative electrode that can be use in the organic EL device is an electrode that has a function of injecting electrons into the electron injection layer, the electron transport layer, and the light emission layer. In general, metals and alloys with a small work function (approximately 4 eV or less) are suitable. Specifically included are platinum, gold, silver, copper, iron, tin, zinc, aluminum, indium, chromium, lithium, sodium, potassium, calcium, magnesium; however, lithium, sodium, potassium, calcium, and magnesium is preferable in order to improve the properties of the device by the increase in electron injection efficiency. As an alloy, it is possible to use alloys with metals such as aluminum or silver including the above-described metals with a low work function, or an electrode with a stacked structure of these, and the like. In an electrode of a stacked structure, inorganic salt like lithium fluoride can also be used. In addition, in a case where light emission is gained in the side of the negative electrode instead of the side of the positive electrode, the transparent electrode that enables the film formation at a low temperature may be employed. Examples of a method for forming a negative electrode film include, without any particular limitation, vapor deposition methods, electron beam methods, sputtering methods, chemical reaction methods, application methods, and the like. The resistance of the negative electrode is not limited, as long as the resistance enables the supply of electric current enough for the light emission of the device; however, the resistance is preferably a low resistance in terms of the power consumption of the device, and is preferably in the order of several hundreds to several ohms per square. The film thickness is usually employed in a range of 5 to 500 nm, preferably 10 to 300 nm.

In addition, for the sake of sealing and protection, the negative electrode can be protected by oxides, nitrides or mixtures thereof such as titanium oxide, silicon nitride, silicon oxide, silicon oxynitride and germanium oxide, polyvinyl alcohol, vinyl chloride, hydrocarbon based macromolecule, fluorine based macromolecule and the like, and can be sealed together with a dehydration agent such as barium oxide, phosphorus pentoxide and calcium oxide and the like.

In addition, in order to gain light emission, it is generally preferable to produce an electrode on the base plate having a sufficient transparency within the light emission wavelength region of the device. Examples of a transparent base plate include a glass base plate and polymer base plate. In the glass base plate, a soda lime glass, an alkali-free glass, quartz and the like are used as long as there is a sufficient thickness enough to keep mechanical strength and heat resistance, and the thickness of 0.5 mm or more is preferable. With regard to the materials of glass, a material with less eluted ions from glass is suitable, and an alkali-free glass is preferential. As such a material of glass, soda lime glass provided with a barrier coat such as $SiO_2$ are commercially available and this soda lime glass can also be used. In addition, examples of a base plate composed of a polymer other than glass include polycarbonate, polypropylene, polyether sulfone, polyethylene terephthalate, acrylic plate, and the like.

The organic thin film of the organic EL device is formed as one layer or a plurality of layers between the positive electrode and the negative electrode. By incorporating a compound represented by the above general formula (1) into the organic thin film, a device that emits light by electrical energy is obtained.

"Layer" with regard to one layer or a plurality of layers that forms an organic thin film means a positive hole transport layer, an electron transport layer, a positive hole transportable light emission layer, an electron transportable light emission layer, a positive hole rejection layer, an electron rejection layer, a positive hole injection layer, an electron injection layer, a light emission layer, or as shown in the following configuration example 9), a single layer possessing all of the functions of these layers. Examples of the configuration of layer that forms an organic thin film in the present invention include the following configuration examples 1) to 9), and any of these configurations can be employed.

Configuration Examples

1) Positive hole transport layer/electron transportable light emission layer.
2) Positive hole transport layer/light emission layer/electron transport layer.
3) Positive hole transportable light emission layer/electron transport layer.
4) Positive hole transport layer/light emission layer/positive hole rejection layer.
5) Positive hole transport layer/light emission layer/positive hole rejection layer/electron transport layer.
6) Positive hole transportable light emission layer/positive hole rejection layer/electron transport layer.
7) A configuration in which a positive hole injection layer is provided as further one layer before a positive hole transport layer or a positive hole transportable light emission layer, in each of the above combinations of 1) to 6).
8) A configuration in which an electron injection layer is provided as further one layer before an electron transport layer or an electron transportable light emission layer in each of the above combinations of 1) to 7).
9) A configuration in which materials used in the above combinations of 1) to 8) are mixed with each other, and which have only a single layer containing these mixed materials.

It is noted that the above 9) may be provided with a single layer formed by a material, which is generally referred to as bipolar light-emitting material; or, a layer including the light-emitting material and the positive hole transport material or electron transport material as one layer. In general, it is possible with the aid of multi-layered structure to transport charges, i.e., positive holes and/or electrons efficiently, and recombine these charges. In addition, efficiency of light emission can be improved by reducing the quenching of the charges and the like to avoid the decrease in the stability of the device.

Figure 2:
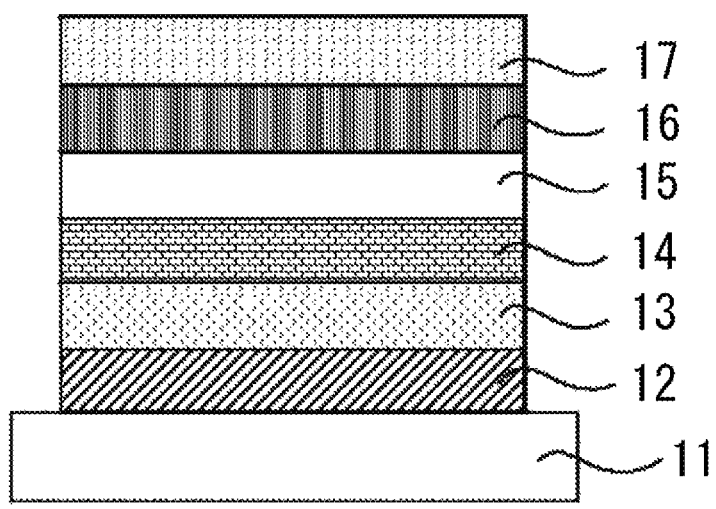
FIG. 2 is a schematic cross-sectional view showing an example of the layer configuration of the organic electroluminescence device.

One aspect of the organic EL device provided on the base plate is shown in FIG. 2. The configuration shown in FIG. 2 is an aspect in which in the above aspect of 2), a positive hole injection layer 13 is provided before the positive hole transport layer 14.

The positive hole injection layer and the positive hole transport layer is formed by stacking a positive hole transport material alone, or by stacking a mixture of two or more kinds of the positive hole transport materials. As a positive hole transport material, with preference, it is possible to use triphenylamines such as N,N'-diphenyl-N,N'-di(3-methylphenyl)-4,4"-diphenyl-1,1'-diamine and N,N'-dinaphthyl-N, N'-diphenyl-4,4'-diphenyl-1,1'-diamine, heterocyclic compounds represented by bis(N-allyl carbazol) or bis(N-alkylcarbazol), pyrazoline derivatives, stilbene based compounds, hydrazone based compounds, triazole derivatives, oxadiazole derivatives and porphyrin derivatives, as well as, with regarad to polymer based one, polycarbonates, styrene derivatives, polyvinyl carbozoles and polysilanes having the early described monomers in the side chain, and the like. The positive hole transport material is not limited in particular, as long as the positive hole transport material is a substance that can form a thin film required for the production of the device, can inject positive holes from the electrode, and in addition, can transport positive holes. Examples of a positive hole injection layer disposed between the positive hole transport layer and the positive electrode in order to improve positive hole injectability include positive hole injection layers produced by starburst amines such as phthalocyanine derivative and m-MTDATA (4,4',4"-tris[phenyl(m-tolyl)amino]triphenylamine), as well as, with regard to macromolecule based one, polythiophen such as PEDOT (poly(3,4-ethylenedioxythiophene)), polyvinyl carbozole derivatives, and the like.

The electron transport layer is formed by electron transport material alone, or formed by stacking a mixture of two or more kinds of the materials. As the electron transport material, it is necessary to transport electrons efficiently from the negative electrode between the electrodes to which an electric field is applied. It is preferable for the electron transport material to be with a high electron injection efficiency, and efficiently transport the injected electrons. For the sake of this, the electron transport material is required to be a substance that has a great electron affinity as well as great electron mobility, and in addition, has excellent stability, and in which it tends not to generate impurities to be traps during the production and the use. Examples of a substance that meets such conditions, without any particular limitation include quinolinol derivative metal complexes represented by a tris(8-quinolinato)aluminum complex, tropolone metal complexes, perylene derivatives, perinone derivatives, naphthalimide derivatives, naphthalic acid derivatives, oxazole derivatives, oxadiazole derivatives, triazole derivatives, thiadiazole derivatives, triazole derivatives, bisstyryl derivatives, pyrazine derivatives, phenanthroline derivatives, benzooxazole derivatives, quinoxaline derivatives, and the like. These electron transport materials can be used alone; however, these electron transport materials can be used as a stack or a mixture with a different electron transport material. Examples of an electron injection layer disposed between the electron transport layer and the negative electrode in order to improve electron injectability include metals such as cesium, lithium and strontium, and lithium fluoride, and the like.

The positive hole rejection layer is formed by a positive hole blocking substance alone, or formed by stacking and mixing of two or more kinds of substances. As the positive hole blocking substance, preference is given to phenanthroline derivatives such as bathophenanthroline and bathocuproine, silole derivatives, quinolinol derivative metal complexes, oxadiazole derivatives, oxazole derivative and the like. The positive hole blocking substance is not limited in particular, as long as the positive hole blocking substance is a compound in which positive holes are discharged from the side of the negative electrode to the outside of the device to enable the avoidance of the decrease in the light emission efficiency.

A light emission layer means an organic thin film that emits light, and can be considered as, for example, a positive hole transport layer, an electron transport layer, or bipolar transport layer having intense light emittability. The light emission layer has no problem as long as the light emission layer is formed by a light-emitting material (a host material, a dopant material and the like), and this light-emitting material can be either of a mixture of the host material and the dopant material, or the host material alone. The host materials and the dopant materials can be respectively one kind of material, or a combination of a plurality of materials. The dopant material can be included in the entire host material, or can be included partially in the host material. The dopant material can be stacked or can be dispersed. Examples of materials of the light emission layer include the same materials as the materials of the above-described positive hole transport layers and the electron transport layer. Examples of the materials used in the light emission layer include carbazol derivatives, anthracene derivatives, naphthalene derivatives, phenanthrene derivatives, phenylbutadiene derivatives, styryl derivatives, pyrene derivatives, perylene derivatives, quinoline derivatives, tetracene derivatives, perylene derivatives, quinacridone derivatives, coumarin derivatives, porphyrin derivatives, phosphorescent metal complexes (Ir complex, Pt complex, Eu complex and the like), and the like.

In general, the formation method of the organic thin film of organic EL device can employ resistance heating vapor deposition, which is a vacuum process, electron beam vapor deposition, sputtering, molecule stacking method, casting, which is a solution process, coating methods such as spin coating, dip coating, blade coating, wire bar coating and spray coating, or alternatively, printing methods such as ink jet printing, screen-printing, offset printing and anastatic printing, approach of soft lithography such as microcontact printing methods, and the like, and in addition, methods by a combination of two or more of these approaches. The thickness of each layer depends on the resistance value and the charge mobility of the substances in each layer, and therefore, cannot be limited; however, the thickness of each layer is selected from 0.5 to 5000 nm. The thickness of each layer is preferably, 1 to 1000 nm, and more preferably 5 to 500 nm.

A device that emit light efficiently with a low electrical energy is obtained by incorporating a compound represented by the above general formula (1) into a thin film as one or more of thin layers as such as a light emission layer, a positive hole transport layer and an electron transport layer that are present between positive electrode and negative electrode, of the organic thin films constituting an organic EL device.

The compound represented by the above general formula (1) can be suitably used as a positive hole transport layer, a light emission layer, or an electron transport layer. For example, the compound represented by the above general formula (1) can be used in combination with the above-described electron transport material or positive hole transport material, and light-emitting material, or can be used as a mixture with these.

A compound represented by the above general formula (1) can be used as a host material and can be used in combination with the dopant material. In this case, as specific examples of the dopant material, it is possible to use perylene derivatives such as bis(diisopropylphenyl)perylenetetracarboxylic imide, perinone derivatives, 4-(dicyanomethylene)-2-methyl-6-(p-dimethylaminostyryl)-4H pyran (DCM) and analogs thereof, metal phthalocyanine derivatives such as magnesium phthalocyanine and aluminum chlorophthalocyanine, rhodamine compounds, deazaflavin derivatives, coumarin derivatives, oxazine compounds, squarylium compounds, violanthrone compounds, nile red, pyrromethene derivatives such as 5-cyanopyrromethene-BF4 complexes, and in addition, Eu complexes with ligands such as acetylacetone or benzoyl acetone and phenanthroline as phosphorescent materials, and porphyrins such as Ir complexes, Ru complexes, Pt complexes and Os complexes, and orthometal type metal complexes, and the like, without limited to these in particular. In addition, in a case of mixing two kinds of dopant materials, it is possible to obtain light emission with improved color purity by efficiently transferring energy from the host dye using an assist dopant like rubrene. In any cases, the doping of those with a high fluorescence quantum efficiency yield is preferable in order to obtain high brightness properties.

The amount of the dopant material used is usually 30% by mass or less in relation to host material due to the fact that an excessive amount of the dopant material results in a concentration quenching phenomenon. Preferably, the amount of the dopant material used is 20% by mass or less, and further preferably 10% by mass or less. As a method of doping the host material with the dopant material in the light emission layer, it is possible to accomplish this doping by a co-vapor-deposition method together with the host material; however, it is also possible to previously mix the dopant material with the host material, and then, vapor-deposit them simultaneously. In addition, it is possible to use the dopant material with being sandwiched between the host materials.

In this case, the dopant layer as one layer or two or more layers may be stacked with the host material.

These dopant layers can form each layer by itself, or can be used as a mixture. In addition, the dopant materials can also be used as polymeric binders with being dissolved or dispersed in solvent-soluble resins such as polyvinyl chloride, polycarbonate, polystyrene, polystyrene sulfonate, poly (N-vinylcarbazol), poly(methyl) (meth) acrylate, polybutyl methacrylate, polyester, polysulfone, polyphenylene oxide, polybutadiene, hydrocarbon resins, ketone resins, phenoxy resins, polysulfone, polyamide, ethyl cellulose, vinyl acetate, ABS resins (acrylonitrile-butadiene-styrene resin) and polyurethane resins, or alternatively, curable resins such as phenol resins, xylene resins, petroleum resins, urea resins, melamine resins, unsaturated polyester resins, alkyd resins, epoxy resins and silicone resins.

An organic EL device can be suitably used as a flat panel display. In addition, the organic EL device can also be used as a flat back light, and in this case, can be used as any of an organic EL device emitting color light and an organic EL device emitting white light. The back light is mainly used for the purpose of improving the visibility of a display of non-self-luminous, and is used in displays such as liquid crystal displays, clocks, audio instruments, motor vehicle panels, indicator panels, and signs. In particular, a conventional back light for liquid crystal displays, among others, for personal computer applications involving problems of the slimming down is composed of a fluorescent lamp and a light guide plate, and therefore, the slimming down of the conventional back light is difficult; however, a back light using a light-emitting device of the present invention is characterized by being thin and light weight, and therefore, the above problems are solved. In an analogous way, the back light using a light-emitting device of the present invention can be conveniently used for illumination.

By use of a compound of the present invention represented by the above general formula (1), an organic EL display with high light emission efficiency and a long duration life can be obtained. In addition, by being in combination with thin film transistor device, it is possible to provide, in a low cost way, an organic EL display in which on-off phenomenon of an applied voltage is electrically controlled with high accuracy.

[Information about Organic Semiconductor Laser Device]

The compound represented by the above general formula (1) is a compound having near-infrared light emission properties, and therefore, is expected to be utilized as an organic semiconductor laser device. In other words, it is expected that light is amplified to lead to laser oscillation by incorporating a resonator structure into an organic semiconductor laser device containing a compound represented by the above general formula (1) to inject carriers efficiently so that the density of the excited state is sufficiently increased. Conventionally, it is indicated that only laser oscillation by light excitation is observed, and it is very difficult to accomplish the fact, which is required for laser oscillation by electrical excitation, that dense carriers are injected into the organic semiconductor device to generate dense excited state; however, by using an organic semiconductor device containing a compound represented by the above general formula (1), it is likely expected for highly efficient light emission (electroluminescence) to occur.

EXAMPLE

The present invention will be further described in detail below with reference to Examples; however, the present invention is not limited to these examples. The structures of the compounds according to synthesis examples were determined by the mass analysis spectra and the nuclear magnetic resonance (NMR) spectra, as necessary. In Examples and Comparative Examples, the measurements by applying an electric current and a voltage to organic photoelectric conversion devices were conducted by using a semiconductor parameter analyzer 4200-SCS (manufactured by Keithley Instruments). Irradiation of incident light was conducted by PVL-3300 (manufactured by ASAHI SPECTRA Co., Ltd.) using a light source with an irradiated light intensity of 130 μW and a half width of 20 nm to perform the measurements in a range of 350 nm to 1100 nm.

[Example 1] Synthesis of Compound (1-1)

[Formula 14]

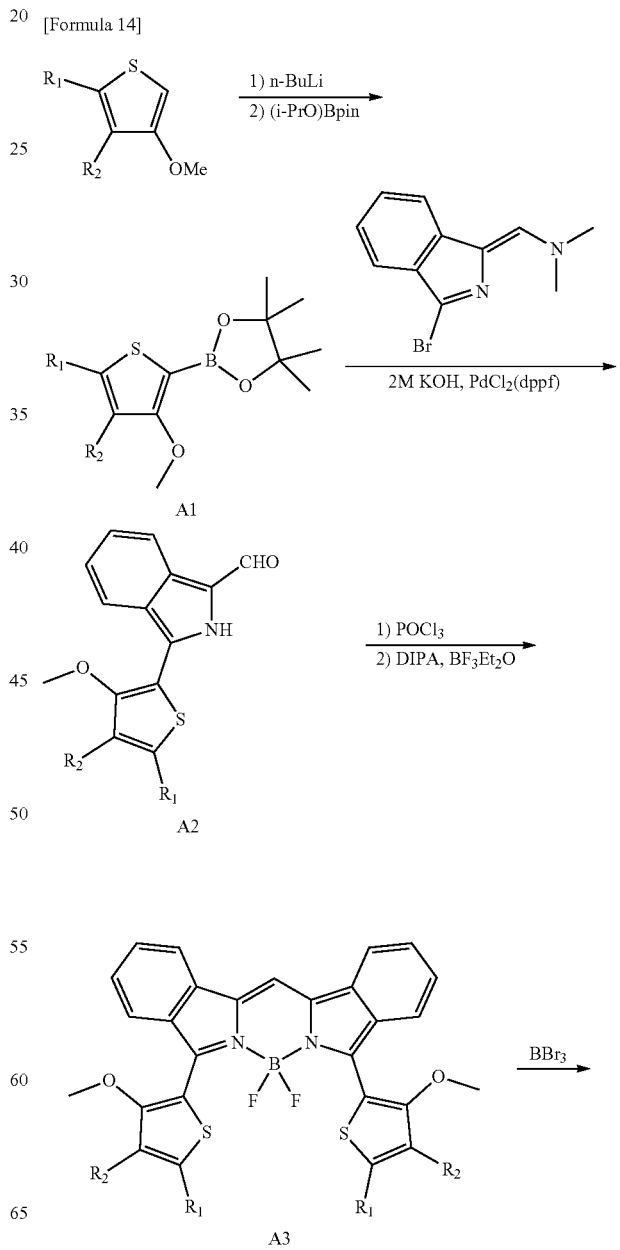

-continued

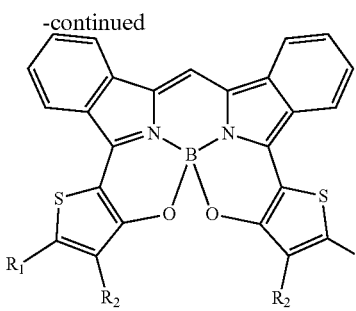

($R_1, R_2 = H$)

The synthesis of a compound A3 was conducted using a known method (RSC Adv., 2016, 6, 52180-52188), on a compound A2 obtained by Suzuki-Miyaura cross coupling of a known compound, 1-(3-bromo-1H-isoindol-1-ylidene)-N,N-dimethylmethanamine (Tetrahedron, 2011, 67, 2072-2080) with a compound A1. The obtained BODIPY dye was reacted with boron tribromide to obtain a B—O chelate type dibenzopyrromethene borone chelate compound.

Synthesis of Compound A1

3-methoxythiophene (100 mmol) and tetrahydrofuran (500 mL) was added to a flask, and the reaction system was cooled to −78° C. under a nitrogen atmosphere. Then, n-butyllithium (100 mmol) was slowly added dropwise, and after stirring for one hour, 2-isopropoxy-4,4,5,5-tetramethyl-1,3,2-dioxaborolane (100 mmol) was added. The reaction system was cooled to a room temperature, and stirred for another three hours. Water was added to the reaction system followed by separation, and the obtained crude product was purified by silica gel column chromatography (developing solvent: ethyl acetate) to obtain a compound A1 as a white fine crystal (42.7 mmol, yield: 43%).

$^1$H NMR (400 MHz, CDCl$_3$) δ(ppm)=7.47 (d, 1H), 6.89 (d, 1H), 3.91 (s, 3H), 1.34 (s, 12H).

Synthesis of Compound A2

1-(3-bromo-1H-isoindol-1-ylidene)-N,N-dimethylmethanamine (40 mmol, synthesized with reference to Tetrahedron, 2011, 67, 2072-2080), a compound A1 (42 mmol), dioxane (700 mL), an aqueous solution of potassium hydroxide (2M, 700 mL) were added to a flask followed by nitrogen bubbling, and the contents of the flask were stirred at 90° C. for 3 hours with heating. After cooling the reaction system to a room temperature, water was added followed by separation with chloroform, and the obtained crude product was purified by silica gel column chromatography (developing solvent: chloroform) to obtain a compound A2 as a greenish yellow powder (17.8 mmol, yield: 45%).

$^1$H NMR (400 MHz, CD$_2$Cl$_2$) δ(ppm)=9.87 (s, 1H), 8.09 (d, 1H), 7.98 (d, 1H), 7.43-7.37 (m, 2H), 7.25 (t, 1H), 7.06 (d, 1H), 4.15 (s, 3H).

Synthesis of Compound A3

A compound A2 (7.8 mmol) and dichloromethane (150 mL) were added to a compound A3, and the reaction system was cooled to 0° C. under a nitrogen atmosphere. Then, phosphoryl chloride (7.8 mmol) was added to the reaction system together with 7 mL of dichloromethane, and the reaction system was cooled to a room temperature, followed by stirring for another four 4 hours. After adding diisopropylamine (7.8 mL) and stirring for 10 minutes, a boron trifluoride diethyl ether complex (9.3 mL) was added and stirred for another two hours. The reaction solution was washed with a saturated saline, and the obtained crude product was purified by silica gel column chromatography (developing solvent: chloroform) to obtain a compound A3 as a metal lustered purple powder (1.9 mmol, yield: 50%).

$^1$H NMR (400 MHz, CD$_2$Cl$_2$) δ(ppm)=7.92 (d, 2H), 7.82 (s, 1H), 7.60 (d, 2H), 7.57 (d, 2H), 7.48 (t, 2H), 7.28 (t, 2H), 7.02 (d, 2H), 3.84 (s, 6H), EI-MS (m/z): 516 [M]$^+$.

Synthesis of Compound (1-1)

A compound A3 (2.5 mmol) and dichloromethane (180 mL) were added to a flask, and the reaction system was cooled to 0° C. under a nitrogen atmosphere. Then, boron tribromide (9.1 mL) was added to the reaction system, and the reaction system was stirred for another four hours while being at 0° C. After confirming the disappearance of the source material by TLC (thin layer chromatography), the reaction solution was added into saturated aqueous sodium bicarbonate. The precipitate was filtered, and filter cake was washed with water and methanol to obtain a deep green compound (1-1). (1.8 mmol, yield: 73%).

$^1$H NMR (400 MHz, CDCl$_3$) δ(ppm)=8.02 (d, 2H), 7.94 (d, 2H), 7.57 (s, 1H), 7.51 (t, 2H), 7.43 (d, 2H), 7.38 (t, 2H), 6.85 (d, 2H), EI-MS (m/z): 448 [M]$^+$.

[Example 2] Synthesis of Compound (1-14)

A compound (1-14) in which $R_1$ is a benzene ring and $R_2$ is a hydrogen atom was synthesized in a manner similar to that in Example 1, except for the fact that source material was changed.

$^1$H NMR (400 MHz, CDCl$_3$) δ(ppm)=8.07 (d, 2H), 7.96 (d, 2H), 7.68 (d, 4H), 7.56 (s, 1H), 7.53 (t, 2H), 7.43-7.39 (m, 6H), 7.33 (t, 2H), 7.15 (s, 2H), EI-MS (m/z): 600 [M]$^+$.

[Example 3] Synthesis of Compound (1-39)

A compound (1-39) in which $R_1$ is a pyridine ring and $R_2$ is a hydrogen atom was synthesized in a manner similar to that in Example 1, except for the fact that the source material was changed.

$^1$H NMR (400 MHz, CDCl$_3$) δ(ppm)=8.64 (d, 4H), 8.10 (d, 2H), 8.01 (d, 2H), 7.65 (s, 1H), 7.58 (t, 2H), 7.52-7.46 (m, 6H), 7.31 (s, 2H), EI-MS (m/z): 602 [M]$^+$.

[Example 4] Synthesis of Compound (1-64)

A compound (1-64) in which $R_1$ is a benzooxadiazole ring and $R_2$ is a hydrogen atom was synthesized in a manner similar to that in Example 1, except for the fact that the source material was changed.

$^1$H NMR (400 MHz, CDCl$_3$) δ (ppm)=8.11 (d, 2H), 8.07 (s, 2H), 8.03 (d, 2H), 7.87 (d, 2H), 7.75 (d, 2H), 7.67 (s, 1H), 7.61 (t, 2H), 7.53-7.49 (m, 2H), 7.32 (s, 2H).

[Example 5] Synthesis of Compound (1-66)

A compound (1-66) in which $R_1$ is a benzothiadiazole ring and $R_2$ is a hydrogen atom was synthesized in a manner similar to that in Example 1, except for the fact that the source material was changed. EI-MS (m/z): 716[M]$^+$.

[Example 6] Synthesis of Compound (1-30)

A compound (1-30) in which $R_1$ and $R_2$ are connected to each other to form a benzene ring was synthesized in a manner similar to that in Example 1, except for the fact that the source material was changed. EI-MS (m/z): 548[M]$^+$.

[Example 7] Synthesis of Compound (1-49)

A compound (1-49) in which $R_1$ is a benzene ring having trifluoromethyl group and $R_2$ is a hydrogen atom was synthesized in a manner similar to that in Example 1, except for the fact that the source material was changed. EI-MS (m/z): 736[M]+.

[Comparative Example 1] Synthesis of Comparative Compound (2-1)

A comparative compound (2-1) represented by the following formula having B—O chelation by benzene rings used for the substitution at 3 and 5-positions of BODIPY, respectively, was synthesized in a manner similar to that in Example 1, except for the fact that the source material was changed.

$^1$H NMR (400 MHz, CDCl$_3$) δ(ppm)=8.25 (d, 4H), 7.99 (d, 2H), 7.76 (s, 1H), 7.53 (t, 2H), 7.43-7.36 (m, 4H), 7.17 (t, 2H), 6.98 (d, 2H), EI-MS (m/z): 436 [M]+.

[Formula 15]

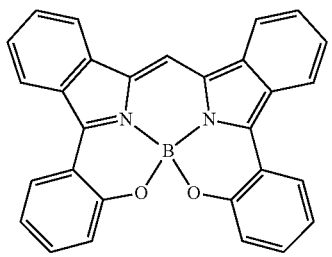

(2-1)

[Example 8] Absorption Spectrum in Chloroform

With regard to the compounds of the present invention obtained in Examples 1 to 7 and the compound obtained in Comparative Example 1, the absorption spectra were measured in a chloroform solution. The results were summarized in Table 1, and it has been found that the maximum absorption wavelength ($\lambda_{MAX}$) of any compound of Examples at 700 nm to 2500 nm has a longer wavelength than the comparative compound (2-1).

TABLE 1

| Compound | Absorption in chloroform solution, $\lambda_{max}$ (nm) |
|---|---|
| (1-1) | 769 |
| (1-14) | 826 |
| (1-39) | 829 |
| (1-64) | 855 |
| (1-66) | 855 |
| (1-30) | 790 |
| (1-49) | 829 |
| (2-1) | 723 |

[Example 9] Production and Evaluation of Thin Film Using Compound (1-1)

Figure 3:
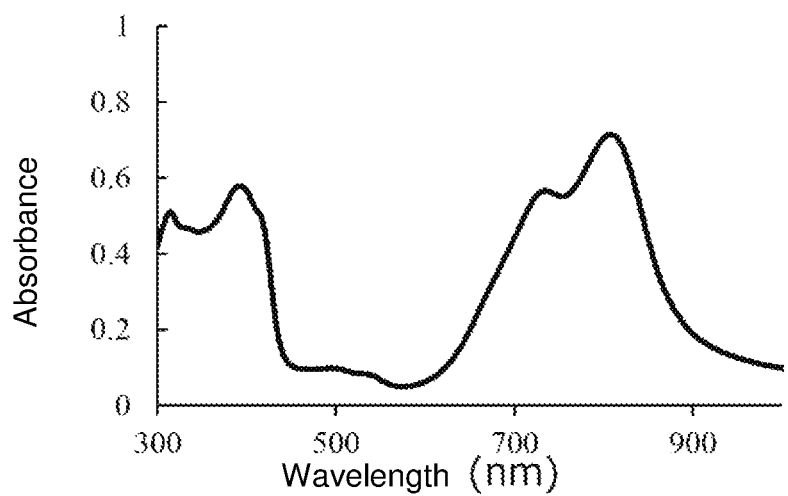
FIG. 3 shows the absorption spectrum of the thin film of Example 9.

A compound (1-1) previously purified by sublimation was vacuum vapor-deposited by resistance heating onto a glass base plate to achieve a film thickness of 80 nm, and the absorption spectrum of the obtained organic thin film was measured. The obtained absorption spectrum is shown in FIG. 3. The absorption edge of the main absorption band of the compound (1-1) in a thin film state was observed at 886 nm.

Figure 4:
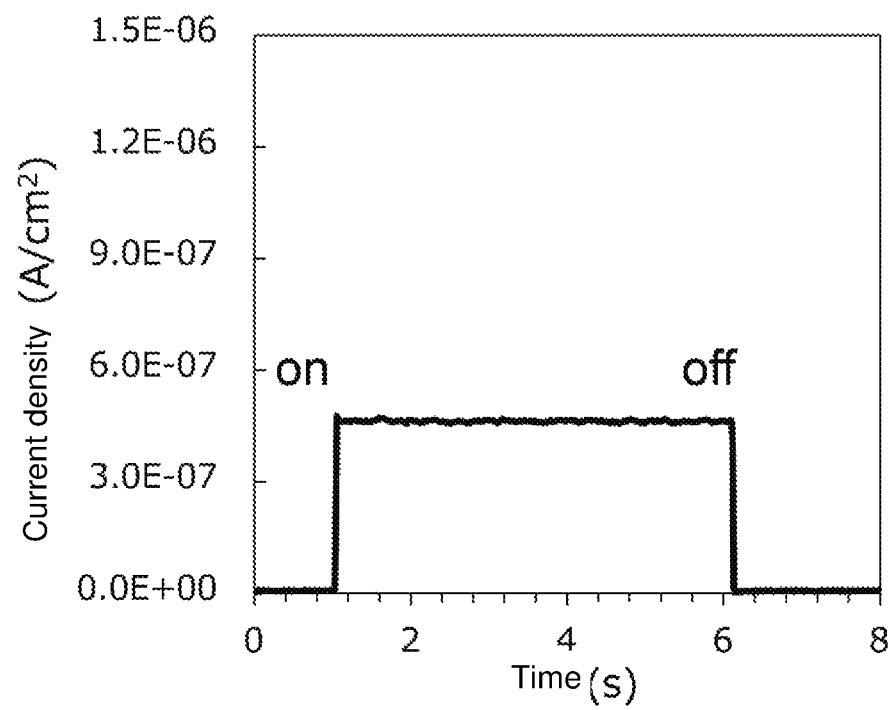
FIG. 4 shows the photoelectric current responsivity in the photoelectric conversion device of Example 10.

[Example 10] Production and Evaluation of Organic Photoelectric Conversion Device A compound (1-1) was vacuum vapor-deposited by resistance heating onto a previously washed ITO transparent conductive glass (manufactured by GEOMATEC Co., Ltd., ITO film thickness of 150 nm) to achieve the deposition to a film thickness of 80 nm. Then, aluminum as an electrode was vacuum vapor-deposited by resistance heating to achieve a film thickness of 100 nm by this vacuum vapor deposition by resistance heating, so that an organic photoelectric conversion device of the present invention was produced. In a situation where ITO and aluminum were used as electrodes and light irradiation was conducted at 830 nm, the photoelectric current responsivity at an applied voltage of 1 V was measured, and as a result of this, the dark current proved to be $1.47 \times 10^{-10}$ [A/cm$^2$] and light current proved to be $3.34 \times 10^{-7}$ [A/cm$^2$], and the light-dark ratio was $2.3 \times 10^3$. The electric current responsivity of the device at 1 V is shown in FIG. 4.

[Example 11] Production and Evaluation of Thin Film Using Compound (1-66)

Figure 5:
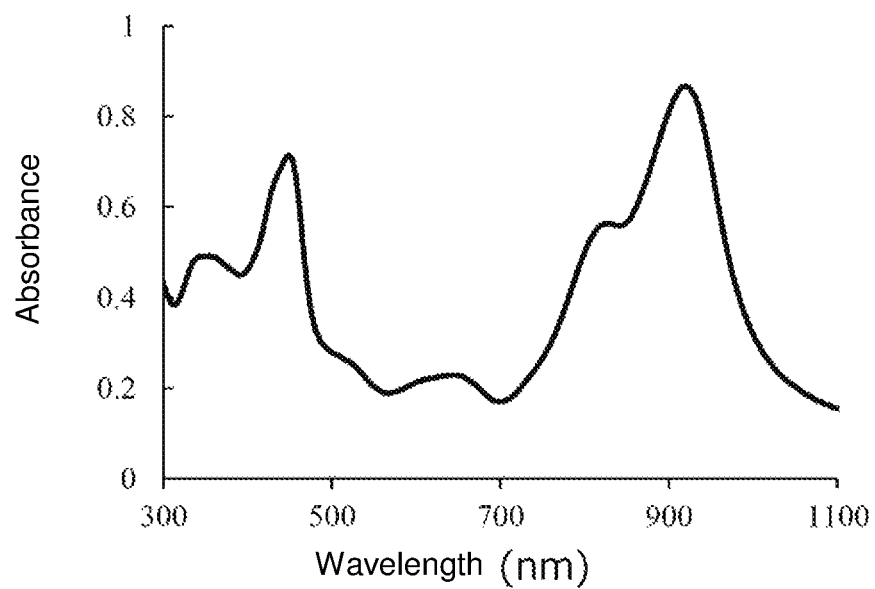
FIG. 5 shows the absorption spectrum of the thin film of Example 11.

A compound (1-66) previously purified by sublimation was vacuum vapor-deposited by resistance heating onto a glass base plate with a film thickness of 100 nm, and the absorption spectrum of the obtained organic thin film was measured. The obtained absorption spectrum was shown in FIG. 5. The absorption edge the main absorption band of the compound (1-66) in a thin film state was observed at 996 nm.

Figure 6:
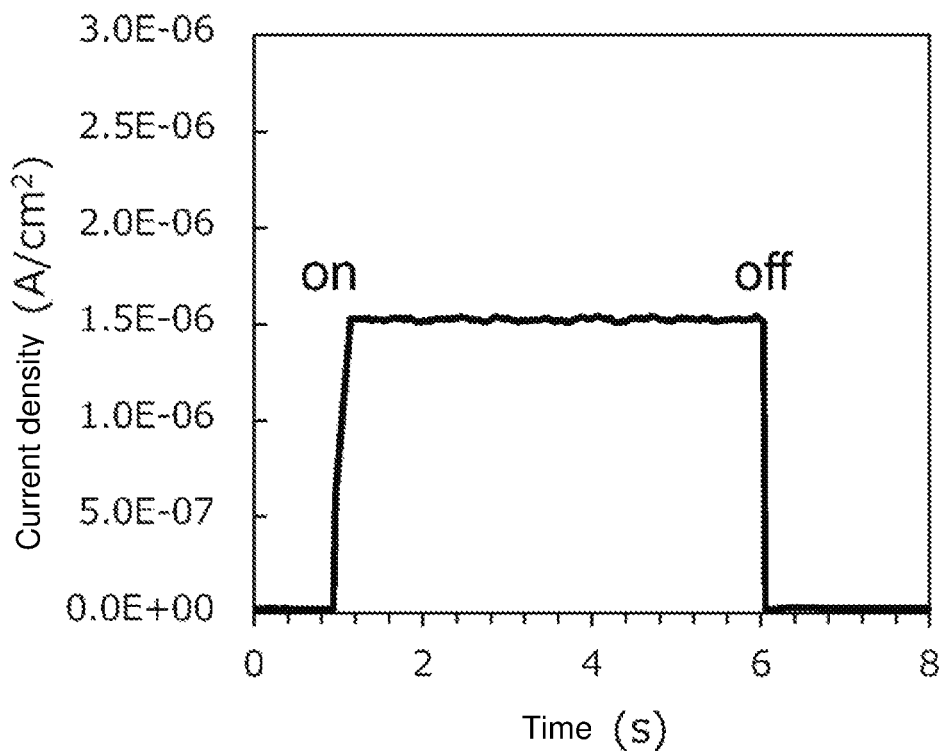
FIG. 6 shows the photoelectric current responsivity in the photoelectric conversion device of Example 12.

[Example 12] Production and Evaluation of Organic Photoelectric Conversion Device A compound (1-66) was vacuum vapor-deposited by resistance heating onto a previously washed ITO transparent conductive glass (manufactured by GEOMATEC Co., Ltd., ITO film thickness of 150 nm) to achieve a deposited film thickness of 100 nm. Then, aluminum as an electrode was vacuum vapor-deposited by resistance heating to achieve a film thickness of 100 nm by this vacuum vapor deposition by resistance heating, so that an organic photoelectric conversion device of the present invention was produced. In a situation where ITO and aluminum were used as electrodes and light irradiation was conducted at 900 nm, the photoelectric current responsivity at an applied voltage of 1 V was measured, and as a result of this, the dark current proved to be $2.37 \times 10^{-8}$ [A/cm$^2$], light current proved to be $1.52 \times 10^{-6}$ [A/cm$^2$], and the light-dark ratio was $6.4 \times 10^1$. The electric current responsivity of the device at 1 V is shown in FIG. 6.

[Example 13] Production and Evaluation of a Thin Film Using the Compound (1-14)

Figure 7:
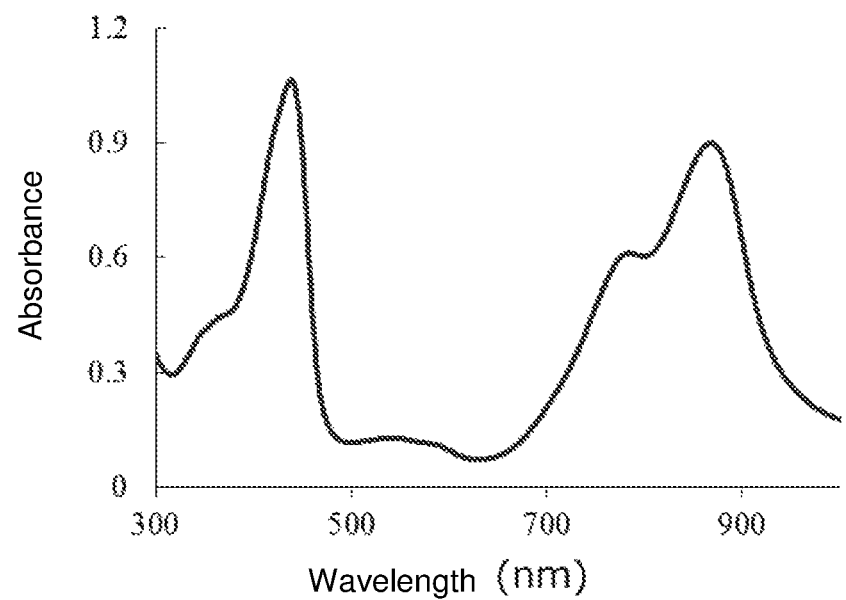
FIG. 7 shows an absorption spectrum of the thin film of Example 13.

A compound (1-14) previously purified by sublimation was vacuum vapor-deposited by resistance heating onto a glass base plate to achieve a film thickness of 90 nm, and the absorption spectrum of the obtained organic thin film was measured. The obtained absorption spectrum was shown in FIG. 7. The absorption edge of the main absorption band of the compound (1-14) in a thin film state was observed at 938 nm.

Figure 8:
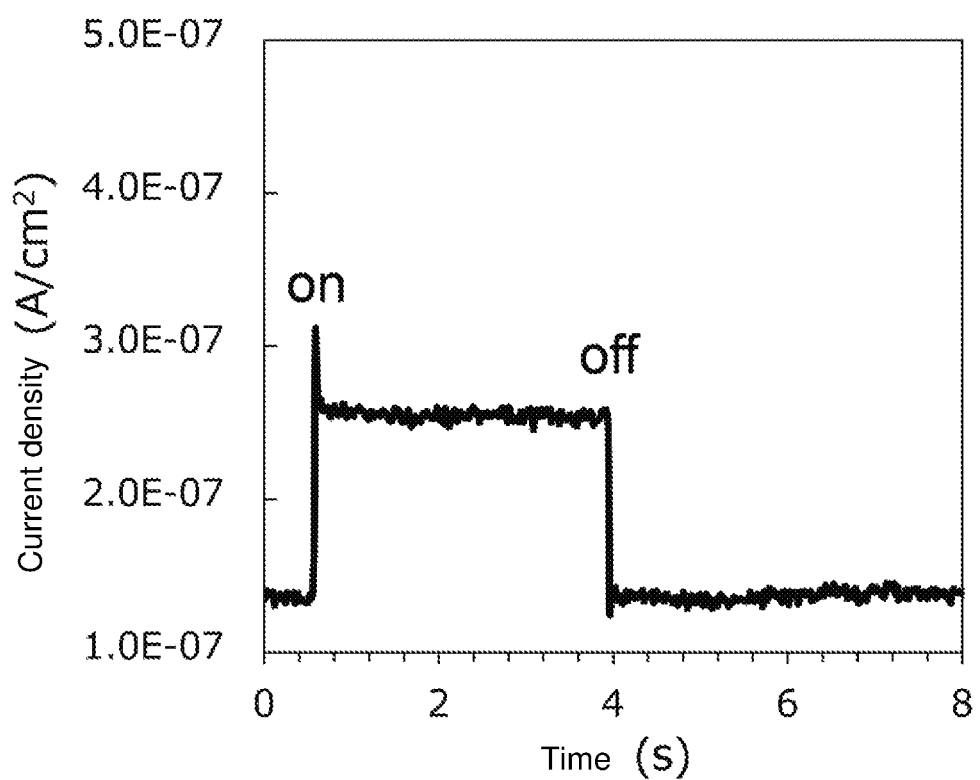
FIG. 8 shows the photoelectric current responsivity in the photoelectric conversion device of Example 14.

[Example 14] Production and Evaluation of Organic Photoelectric Conversion Device The compound (1-14) was vacuum vapor-deposited by resistance heating onto a previously washed ITO transparent conductive glass (manufactured by GEOMATEC Co., Ltd., ITO film thickness of 150 nm) to achieve a deposited film thickness of 90 nm. Then, aluminum as an electrode was vacuum vapor-deposited by resistance heating to achieve a film thickness of 100 nm by this vacuum vapor deposition by resistance heating, so that an organic photoelectric conversion device of the present invention was produced. In a situation where ITO and aluminum were used as electrodes and light irradiation was conducted at 900 nm, the photoelectric current responsivity at an applied voltage of 10 mV was measured, and the dark current proved to be $1.41 \times 10^{-7}$ [A/cm$^2$], the light current proved to be $2.61 \times 10^{-7}$ [A/cm$^2$], and the light-dark ratio was 1.85. The electric current responsivity of the device at 10 mV is shown in FIG. 8.

[Comparative Example 2] Production and Evaluation of Organic Photoelectric Conversion Device Tin phthalocyanine (2) (Tokyo Chemical Industry Co., Ltd.) was vacuum vapor-deposited by resistance heating onto a previously washed ITO transparent conductive glass (manufactured by GEOMATEC Co., Ltd., ITO film thickness of 150 nm) to achieve a film thickness of 200 nm by this deposition. Then, aluminum as an electrode was vacuum vapor-deposited by resistance heating to achieve a film thickness of 100 nm, so that a comparative organic photoelectric conversion device was produced. In a situation where ITO and aluminum were used as electrodes and light irradiation was conducted at 850 nm, photoelectric current responsivity of the device at an applied voltage of 1 V was measured, and as a result of this, the dark current proved to be $3.57 \times 10^{-7}$ [A/cm$^2$], light current proved to be $1.22 \times 10^{-6}$ [A/cm$^2$], and the light-dark ratio was 3.41.

[Comparative Example 3] Production and Evaluation of Thin Film Using Compound (2-1)

A compound (2-1) previously purified by sublimation was vacuum vapor-deposited by resistance heating onto a glass base plate to achieve a film thickness of 80 nm, and the absorption spectrum of the obtained organic thin film was measured. The absorption edge of the main absorption band of the compound (2-1) in a thin film state was observed at 838 nm.

[Comparative Example 4] Production and Evaluation of Organic Photoelectric Conversion Device A compound (2-1) was vacuum vapor-deposited by resistance heating vacuum onto a previously washed ITO transparent conductive glass (manufactured by GEOMATEC Co., Ltd., ITO film thickness of 150 nm) to achieve a deposited film thickness of 80 nm. Then, aluminum as an electrode was vacuum vapor-deposited by resistance heating to achieve a film thickness of 100 nm by this vacuum vapor deposition by resistance heating, so that a comparative organic photoelectric conversion device was produced. In a situation where ITO and aluminum were used as electrodes and light irradiation was conducted at 775 nm, the photoelectric current responsivity at an applied voltage of 1 V was measured, and the dark current proved to be $8.15 \times 10^{-6}$ [A/cm$^2$], light current proved to be $1.42 \times 10^{-5}$ [A/cm$^2$], and the light-dark ratio was 1.75.

The materials of the present invention achieve a longer wavelength due to the fact that aromatic rings of a five-membered ring linked to 3 and 5-positions of BODIPY, respectively, form a six-membered ring each by B—O chelation, and are characterized by absorbing a wavelength in a near-infrared region that cannot be achieved by existing BODIPY dyes like, for example, a comparative compound (2-1), and the nature of the materials of the present invention are as shown in Example 8. In addition, the present materials are applicable to organic electronics devices, and for example, in a case where the present materials were used as a photoelectric conversion material shown in Examples, excellent performance was confirmed. In other words, the photoelectric conversion device using tin phthalocyanine (2) shown in Comparative Example 2, which is a typical near-infrared light absorbing dye, involved intense leakage of the dark current in a state without light irradiation, and therefore, the light-dark ratio was poor and good performance in a form of a device the device has not been expected. In an analogous way, as shown in Comparative Example 4, also with regard to the photoelectric conversion device using the compound (2-1), the degree of the dark current is tremendous, and light-dark ratio is only in single-digit. These results mean that existing organic materials cannot obtain sufficient photoelectric conversion performance in a near-infrared region. On the other hand, with regard to the organic photoelectric conversion device using the compound of the present invention (1-1) or (1-66), a light-dark ratio of double-digit or greater has been obtained in a near-infrared region, and in spite of the similar backbone, the nature of this organic photoelectric conversion device has been remarkably improved. In addition, it has been found that the devices using the above compounds have an excellent durability due to the fact that these devices operate without any problem during the application of voltage of 2 V or higher.

A compound of the present invention is provided with all of synthetic convenience, absorption properties in a near-infrared region, and vapor depositability, and is very useful as a material for an organic electronics device that operates in a near-infrared region.

REFERENCE SIGNS LIST (FIG. 1)
1 Insulation
2 Upper electrode (electrode film)
3 Electron block layer
4 Photoelectric conversion layer
5 Positive hole block layer
6 Lower electrode (electrode film)
7 Insulating substrate or other photoelectric conversion device
(FIG. 2)
11 Base plate
12 Positive electrode
13 Positive hole injection layer
14 Positive hole transport layer
15 Light emission layer
16 Electron transport layer
17 Negative electrode

The invention claimed is:

1. A compound represented by the following formula (1):

[Formula 1]

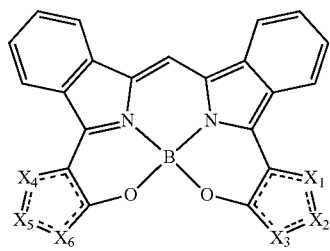

(1)

wherein $X_1$ to $X_6$ in the above formula (1) are each independently of one another a sulfur atom, a carbon atom having a hydrogen atom, or a carbon atom having a substituent $R_0$, and the substituent $R_0$ represents an alkyl group, an alkoxy group, an alkylthio group, an aromatic group, a halogen atom, a hydroxyl group, a mercapto group, a nitro group, a substituted amino group, an unsubstituted amino group, a cyano group, a sulfo group, an acyl group, a sulfamoyl group, an alkylsulfamoyl group, a carbamoyl group, or an alkylcarbamoyl group; and adjacent groups of $X_1$ to $X_6$ may be connected to each other to form a ring structure.

2. The compound according to claim 1, wherein at least one of $X_1$ to $X_3$ is a sulfur atom, and at least one of $X_4$ to $X_6$ is a sulfur atom.

3. A near-infrared light absorbing material comprising the compound according to claim 1.

4. A thin film comprising the compound according to claim 1.

5. An organic electronics device comprising the compound according to claim 1.

6. An organic photoelectric conversion device comprising the compound according to claim 1.

7. An organic electroluminescence device comprising the compound according to claim 1.

8. A compound represented by any of the following formula (2a), formula (2b) and formula (2c):

[Formula 2]

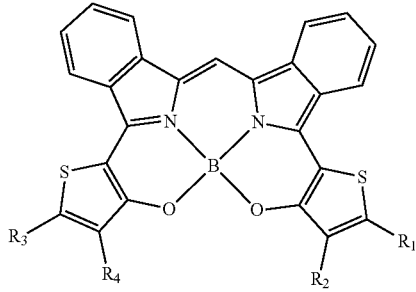

(2a)

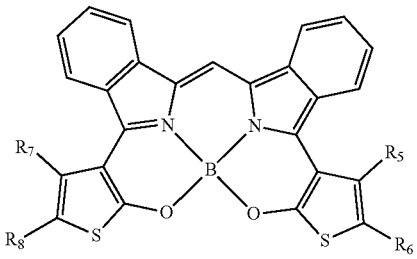

(2b)

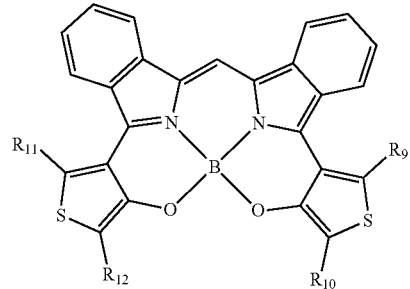

(2c)

wherein $R_1$ to $R_{12}$ in the above formulae (2a), (2b) and (2c) each represent independently of one another a hydrogen atom, an alkyl group, an alkoxy group, an alkylthio group, an aromatic group, a halogen atom, a hydroxyl group, a mercapto group, a nitro group, a substituted amino group, an unsubstituted amino group, a cyano group, a sulfo group, an acyl group, a sulfamoyl group, an alkylsulfamoyl group, a carbamoyl group, or an alkylcarbamoyl group; and adjacent groups of $R_1$ to $R_{12}$ may be connected to each other to form a ring structure.

9. A near-infrared light absorbing material comprising the compound according to claim 8.

10. A thin film comprising the compound according to claim 8.

11. An organic electronics device comprising the compound according to claim 8.

12. An organic photoelectric conversion device comprising the compound according to claim 8.

13. An organic electroluminescence device comprising the compound according to claim 8.

14. A compound represented by the following formula (2a):

[Formula 3]

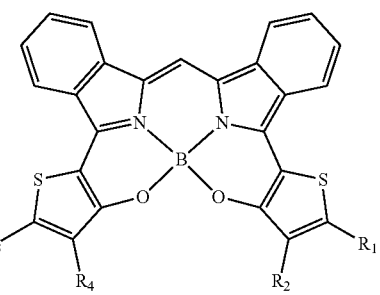

(2a)

wherein $R_1$ to $R_4$ in the above formula (2a) each represent independently of one another a hydrogen atom, an alkyl group, an alkoxy group, an alkylthio group, an aromatic group, a halogen atom, a hydroxyl group, a mercapto group, a nitro group, a substituted amino group, an unsubstituted amino group, a cyano group, a sulfo group, an acyl group, a sulfamoyl group, an alkylsulfamoyl group, a carbamoyl group, or an alkylcarbamoyl group; and adjacent groups of $R_1$ to $R_{12}$ may be connected to each other to form a ring structure.

15. A near-infrared light absorbing material comprising the compound according to claim 14.

16. A thin film comprising the compound according to claim 14.

17. An organic electronics device comprising the compound according to claim 14.

18. An organic photoelectric conversion device comprising the compound according to claim 14.

19. An organic electroluminescence device comprising the compound according to claim 14.

* * * * *